United States Patent
Lung

(10) Patent No.: US 7,902,538 B2
(45) Date of Patent: *Mar. 8, 2011

(54) PHASE CHANGE MEMORY CELL WITH FIRST AND SECOND TRANSITION TEMPERATURE PORTIONS

(75) Inventor: Hsiang Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 109 days.

This patent is subject to a terminal disclaimer.

(21) Appl. No.: 12/266,200

(22) Filed: Nov. 6, 2008

(65) Prior Publication Data

US 2009/0057641 A1   Mar. 5, 2009

Related U.S. Application Data

(63) Continuation of application No. 11/424,177, filed on Jun. 14, 2006, now Pat. No. 7,459,717.

(60) Provisional application No. 60/740,176, filed on Nov. 28, 2005.

(51) Int. Cl.
*H01L 47/00* (2006.01)

(52) U.S. Cl. ............ 257/4; 257/2; 257/5; 257/379; 257/529; 257/537; 365/148; 365/163

(58) Field of Classification Search .......... 257/2, 4, 257/5, 379, 529, 537; 365/148, 163
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,177,475 A | * 12/1979 | Holmberg | 257/2 |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |

(Continued)

FOREIGN PATENT DOCUMENTS

CN    1462478    12/2003

(Continued)

OTHER PUBLICATIONS

"Optimized Thermal Capacitance in a Phase Change Memory Cell Design," IPCOM000141986D, IP.com Prior Art Database, Oct. 18, 2006, 4pp. cited byother.

(Continued)

*Primary Examiner* — Kevin M Picardat
*Assistant Examiner* — Bac H Au
(74) *Attorney, Agent, or Firm* — James F. Hann; Haynes Beffel & Wolfeld LLP

(57) ABSTRACT

A phase change memory cell includes first and second electrodes having generally coplanar surfaces spaced apart by a gap and a phase change bridge electrically coupling the first and second electrodes. The phase change bridge may extend over the generally coplanar surfaces and across the gap. The phase change bridge has a higher transition temperature bridge portion and a lower transition temperature portion. The lower transition temperature portion comprises a phase change region which can be transitioned from generally crystalline to generally amorphous states at a lower temperature than the higher transition temperature portion. A method for making a phase change memory cell is also disclosed.

14 Claims, 20 Drawing Sheets

U.S. PATENT DOCUMENTS

| | | | |
|---|---|---|---|
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,746,892 B2 | 6/2004 | Lee et al. |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi et al. |
| 6,808,991 B1 | 10/2004 | Tung et al. |
| 6,815,704 B1 | 11/2004 | Chen |
| 6,830,952 B2 | 12/2004 | Lung et al. |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |

| | | | | | |
|---|---|---|---|---|---|
| 7,154,774 B2 | 12/2006 | Bedeschi et al. | 2006/0066156 A1 | 3/2006 | Dong et al. |
| 7,164,147 B2 | 1/2007 | Lee et al. | 2006/0073642 A1 | 4/2006 | Yeh et al. |
| 7,166,533 B2 | 1/2007 | Happ | 2006/0091476 A1 | 5/2006 | Pinnow et al. |
| 7,169,635 B2 | 1/2007 | Kozicki | 2006/0094154 A1 | 5/2006 | Lung |
| 7,202,493 B2 | 4/2007 | Lung et al. | 2006/0108667 A1 | 5/2006 | Lung |
| 7,208,751 B2 | 4/2007 | Ooishi et al. | 2006/0110878 A1 | 5/2006 | Lung et al. |
| 7,214,958 B2 | 5/2007 | Happ | 2006/0110888 A1 | 5/2006 | Cho et al. |
| 7,220,983 B2 | 5/2007 | Lung | 2006/0113521 A1 | 6/2006 | Lung |
| 7,229,883 B2 | 6/2007 | Wang et al. | 2006/0118913 A1 | 6/2006 | Yi et al. |
| 7,238,959 B2 | 7/2007 | Chen | 2006/0124916 A1 | 6/2006 | Lung |
| 7,238,994 B2 | 7/2007 | Chen et al. | 2006/0126395 A1 | 6/2006 | Chen et al. |
| 7,248,494 B2 | 7/2007 | Oh et al. | 2006/0131555 A1 | 6/2006 | Liu et al. |
| 7,251,157 B2 | 7/2007 | Osada et al. | 2006/0138467 A1 | 6/2006 | Lung |
| 7,253,429 B2 | 8/2007 | Klersy et al. | 2006/0154185 A1 | 7/2006 | Ho et al. |
| 7,269,052 B2 | 9/2007 | Segal et al. | 2006/0157681 A1 | 7/2006 | Chen et al. |
| 7,277,317 B2 | 10/2007 | Le Phan et al. | 2006/0163554 A1 | 7/2006 | Lankhorst et al. |
| 7,291,556 B2 | 11/2007 | Choi et al. | 2006/0175599 A1 | 8/2006 | Happ |
| 7,309,630 B2 | 12/2007 | Fan et al. | 2006/0198183 A1 | 9/2006 | Kawahara et al. |
| 7,321,130 B2 | 1/2008 | Lung et al. | 2006/0205108 A1 | 9/2006 | Maimon et al. |
| 7,323,708 B2 | 1/2008 | Lee et al. | 2006/0211165 A1 | 9/2006 | Hwang et al. |
| 7,332,370 B2 | 2/2008 | Chang et al. | 2006/0226409 A1 | 10/2006 | Burr et al. |
| 7,336,526 B2 | 2/2008 | Osada et al. | 2006/0234138 A1 | 10/2006 | Fehlhaber et al. |
| 7,351,648 B2 | 4/2008 | Furukawa et al. | 2006/0237756 A1 | 10/2006 | Park et al. |
| 7,359,231 B2 | 4/2008 | Venkataraman et al. | 2006/0281216 A1 | 12/2006 | Chang et al. |
| 7,364,935 B2 | 4/2008 | Lung et al. | 2006/0284157 A1 | 12/2006 | Chen et al. |
| 7,365,385 B2 | 4/2008 | Abbott | 2006/0284158 A1 | 12/2006 | Lung et al. |
| 7,379,328 B2 | 5/2008 | Osada et al. | 2006/0284214 A1 | 12/2006 | Chen |
| 7,385,235 B2 | 6/2008 | Lung et al. | 2006/0284279 A1 | 12/2006 | Lung et al. |
| 7,394,088 B2 | 7/2008 | Lung | 2006/0286709 A1 | 12/2006 | Lung et al. |
| 7,397,060 B2 | 7/2008 | Lung | 2006/0286743 A1 | 12/2006 | Lung et al. |
| 7,423,300 B2 | 9/2008 | Lung et al. | 2006/0289848 A1 | 12/2006 | Dennison |
| 7,426,134 B2 | 9/2008 | Happ et al. | 2007/0008786 A1 | 1/2007 | Scheuerlein |
| 7,449,710 B2 | 11/2008 | Lung | 2007/0010054 A1 | 1/2007 | Fan et al. |
| 7,453,081 B2 | 11/2008 | Happ et al. | 2007/0029606 A1 | 2/2007 | Noh et al. |
| 7,459,717 B2 | 12/2008 | Lung | 2007/0030721 A1 | 2/2007 | Segal et al. |
| 7,485,891 B2 * | 2/2009 | Hamann et al. .................. 257/2 | 2007/0037101 A1 | 2/2007 | Morioka |
| 2001/0055838 A1 | 12/2001 | Walker et al. | 2007/0096162 A1 | 5/2007 | Happ et al. |
| 2002/0070457 A1 | 6/2002 | Sun et al. | 2007/0096248 A1 | 5/2007 | Philipp et al. |
| 2002/0072223 A1 | 6/2002 | Gilbert et al. | 2007/0097739 A1 | 5/2007 | Happ et al. |
| 2002/0081833 A1 | 6/2002 | Li et al. | 2007/0108077 A1 | 5/2007 | Lung et al. |
| 2002/0113273 A1 | 8/2002 | Hwang et al. | 2007/0108429 A1 | 5/2007 | Lung |
| 2002/0182835 A1 | 12/2002 | Quinn | 2007/0108430 A1 | 5/2007 | Lung |
| 2003/0072195 A1 | 4/2003 | Mikolajick | 2007/0108431 A1 | 5/2007 | Chen et al. |
| 2003/0095426 A1 | 5/2003 | Hush et al. | 2007/0109836 A1 | 5/2007 | Lung |
| 2003/0186481 A1 | 10/2003 | Lung | 2007/0109843 A1 | 5/2007 | Lung et al. |
| 2004/0026686 A1 | 2/2004 | Lung | 2007/0111429 A1 | 5/2007 | Lung |
| 2004/0051094 A1 | 3/2004 | Ooishi | 2007/0115794 A1 | 5/2007 | Lung |
| 2004/0051161 A1 | 3/2004 | Tanaka et al. | 2007/0117315 A1 | 5/2007 | Lai et al. |
| 2004/0113137 A1 | 6/2004 | Lowrey | 2007/0121363 A1 | 5/2007 | Lung |
| 2004/0113232 A1 | 6/2004 | Johnson et al. | 2007/0121374 A1 | 5/2007 | Lung et al. |
| 2004/0165422 A1 | 8/2004 | Hideki et al. | 2007/0126040 A1 | 6/2007 | Lung |
| 2004/0178172 A1 | 9/2004 | Huang et al. | 2007/0131922 A1 | 6/2007 | Lung |
| 2004/0188668 A1 | 9/2004 | Hamann et al. | 2007/0131980 A1 | 6/2007 | Lung |
| 2004/0208038 A1 | 10/2004 | Idehara | 2007/0138458 A1 | 6/2007 | Lung |
| 2004/0248339 A1 | 12/2004 | Lung | 2007/0147105 A1 | 6/2007 | Lung et al. |
| 2004/0256610 A1 | 12/2004 | Lung | 2007/0153563 A1 | 7/2007 | Nirschl |
| 2005/0018526 A1 | 1/2005 | Lee | 2007/0154847 A1 | 7/2007 | Chen et al. |
| 2005/0019975 A1 | 1/2005 | Lee et al. | 2007/0155172 A1 | 7/2007 | Lai et al. |
| 2005/0029502 A1 | 2/2005 | Hudgens | 2007/0158632 A1 | 7/2007 | Ho |
| 2005/0062087 A1 | 3/2005 | Chen et al. | 2007/0158633 A1 | 7/2007 | Lai et al. |
| 2005/0093022 A1 | 5/2005 | Lung | 2007/0158645 A1 | 7/2007 | Lung |
| 2005/0106919 A1 | 5/2005 | Layadi et al. | 2007/0158690 A1 | 7/2007 | Ho et al. |
| 2005/0112896 A1 | 5/2005 | Hamann et al. | 2007/0158862 A1 | 7/2007 | Lung |
| 2005/0127349 A1 | 6/2005 | Horak et al. | 2007/0161186 A1 | 7/2007 | Ho |
| 2005/0130414 A1 | 6/2005 | Choi et al. | 2007/0173019 A1 | 7/2007 | Ho et al. |
| 2005/0142731 A1 | 6/2005 | Wicker | 2007/0173063 A1 | 7/2007 | Lung |
| 2005/0145984 A1 | 7/2005 | Chen et al. | 2007/0176261 A1 | 8/2007 | Lung |
| 2005/0167656 A1 | 8/2005 | Sun et al. | 2007/0187664 A1 | 8/2007 | Happ |
| 2005/0191804 A1 | 9/2005 | Lai et al. | 2007/0201267 A1 | 8/2007 | Happ et al. |
| 2005/0201182 A1 | 9/2005 | Osada et al. | 2007/0215852 A1 | 9/2007 | Lung |
| 2005/0212024 A1 | 9/2005 | Happ | 2007/0224726 A1 | 9/2007 | Chen et al. |
| 2005/0212026 A1 | 9/2005 | Chung et al. | 2007/0235811 A1 | 10/2007 | Furukawa et al. |
| 2005/0215009 A1 | 9/2005 | Cho | 2007/0236989 A1 | 10/2007 | Lung |
| 2005/0227177 A1 | 10/2005 | Sun et al. | 2007/0246699 A1 | 10/2007 | Lung |
| 2005/0263829 A1 | 12/2005 | Song et al. | 2007/0249090 A1 | 10/2007 | Philipp et al. |
| 2005/0285096 A1 | 12/2005 | Kozicki | 2007/0257300 A1 | 11/2007 | Ho et al. |
| 2006/0006472 A1 | 1/2006 | Jiang | 2007/0262388 A1 | 11/2007 | Ho et al. |
| 2006/0038221 A1 | 2/2006 | Lee et al. | 2007/0267721 A1 | 11/2007 | Kuh et al. |
| 2006/0043617 A1 | 3/2006 | Abbott | 2007/0274121 A1 | 11/2007 | Lung et al. |

| | | |
|---|---|---|
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2009/0078924 A1 | 3/2009 | Liang et al. |

FOREIGN PATENT DOCUMENTS

| | | |
|---|---|---|
| WO | 0079539 | 12/2000 |
| WO | 0145108 | 6/2001 |
| WO | 0225733 | 3/2002 |

OTHER PUBLICATIONS

"Thermal Condictivity of Crystalline Dielectrics" in CRC Handbook of Chemistry and Physics, Internet Version 2007, (87th edition), David R. Lide, ed Taylor and Franis, Boca Raton, FL. cited by other.
Adler, D. et al., "Threshold Switching in Chalcogenide-Glass Thin Films," J. Appl./Phys 51(6), Jun. 1980, pp. 3289-3309. cited by other.
Adler, David, "Amorphous-Semiconductor Devices," Sci. Amer., vol. 236, pp. 36-48, May 1977. cited by other.
Ahn, S.J. et al., "A Highly Manufacturable High Density Phase Change Memory of 64 Mb and Beyond," IEEE IEDM 2004, pp. 907-910. cited by other.
Atwood, G, et al., "90nm Phase Change Technolgy with .mu. Trench and Lance Cell Elements," VLSI Technolgy, Systems and Applications, Apr. 23-25, 2007, pp. 1-2. cited by other.
Axon Technologies Corporation paper: Technology Description, pp. 1-6. cited by other.
Bedeschi, F. et al., "4-MB MOSFET-Selected Phase-Change Memory Experimental Chip," IEEE, 2004, 4 pp. cited by other.
Blake thesis, "Investigation of GeTeSb5 Chalcogenide Films for Use as an Analog Memeory," AFIT/GE/ENG/00M-04, Mar. 2000, 121 pages. cited by other.
Chao, Der-Sheng, et al., "Low Programming Current Phrase Change Memory Cell with Double GST Thermally Confined Structure," Int'l Symp on VLSI Technology, Systems and Applications, Apr. 23-25, 2007, pp. 1-2. cited by other.
Chen, An et al., "Non-Volatile Resistive Switching for Advanced Memory Application," IEEE IEDM, Dec. 5-7, 2005, 4 pp. cited by other.
Cho, S. L. et al., "Highly Scalable On-axis Confined Cell Structure for High Density PRAM beyond 256Mb," 2005 Symposium on VLSI Technolgy Digest of Technical Papers, pp. 96-97. cited by other.
Gill, Manzur et al., "A High-Performance Nonvolatile Memory Technolgy for Stand-Alone Memory and Embedded Applications," 2002 IEEE-ISSCC Technical Digest (TD 12.4), 7 pp. cited by other.
Ha, Y. H. et al., "An Edge Contact Type Cell fro Phase Change RAM Featuring Very Low Power Consumption," 2003 Symposium on VLSI Technolgy Digest of Technical Papers, pp. 175-176. cited by other.
Haring Bolivar, P. et al., "Lateral Design for Phase Change Random Acces Memory Cells with Low-Current Consumption," presented at 3rd E*PCOS 04 Symposium in Blazers, Principality of Liechtenstein, Sep. 4-7,2004, 4 pp. cited by other.
Horii, H. et al., "A Novel Cell Technology Using N-doped GeSbTe Films for Phase Chage RAM," 2003 Symposium on VLSI Technology Digest of Technical Papers, pp. 177-178. cited by other.

Hwang, Y. N. et al., "Full Integration and Reliability Evaluation of Phase-change RAM Based on 0.24.mu.m-CMOS Technologies," 2003 Symposium on VLSI Technology Digest of Technical Papers, pp. 173-174. cited by other.
Iwasaki, Hiroko et al., "Completely Erasable Phase Change Optical Disk,"Jpn. J. Appl. Phys., Feb. 1992, pp. 461-465, vol. 31. cited by other.
Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet. cited by other.
Kim, Kinam et al., "Reliability Investigations for Manufacturable High Density PRAM," IEEE 43rd Annual International Peliability Physics Symposium, San Jose, 2005, pp. 157-162. cited by other.
Kojima, Rie et al., "Re-Sn-Sb-Te Phase-change Recording Material Having High Crystallization Speed," Proceedings of PCOS 2000, pp. 36-41. cited by other.
Lacita, A. L., "Electrothermal and Phase-change Dynamics in Chalcogenide-based Memories," IEEE IEDM 2004, 4 pp. cited by other.
Lai, Stefan, "Current Status of the Phase Change Memory and Its Future," IEEE IEDM 2003, pp. 255-258. cited by other.
Lai, Stephan et al., OUM-A 180 nm Nonvolatile Memory Cell Element Technolgy for Stand Alone and Embedded Application, IEEE IEDM 2001, pp. 803-806. cited by other.
Lankhorst, Martijn J.R., et al; Low-Cost and Nanoscale Non-Volatile Memory Concept for Future Silicon Chips, Mar. 13, 2005, 6 pp., Nature Materials Advance Online Publication, www.nature.com/naturematerials. cited by other.
Mott, Nevill, "Electrons in Glass," Nobl Lecture, Dec. 8, 1977, Physics, 1977, pp. 403-413. cited by other.
Ovonyx Non-Confidential paper entitled "Ovonic Unified Memory," Dec. 1999, pp. 1-80. cited by other.
Ovshinsky, Sandford R., "Reversible Electrical Switching Phenomena in Disordered Structures," Physical Review Letters, vol. 21, No. 20, Nov. 11, 1968, pp. 1450-1453. cited by other.
Owen, Alan E. et al., "Electronic Conduction and Switching in Chalcogenide Glasses," IEEE Trancactions on Electrons Devices, vol. Ed. 20, No. 2, Feb. 1973, pp. 105-122. cited by other.
Pellizer, F. et al., "Novel .mu.Trench Phase-Change Memory Cell for Embedded and Stand-Alone Non-Volatile Memory Applications," 2004 Symposium on VLSI Technolgy Digest of Technical Papers, pp. 18-19. cited by other.
Prakash, S. et al., "A Guideline for Designing Chalcogenide-Based Glasses for Threshold Switching Characteristics," IEEE Electron Device Letters, vol. 18, No. 2, Feb. 1997, pp. 45-47. cited by other.
Rochefort, C. et al., "Manufacturing of High Aspect-Ration p-n Junctions Using Vapor Phase Doping for Application in Multi-Resurf Devices," IEEE 2002. cited by other.
Schafft, Harry A. et al., "Thermal Conductivity Measurements of Thin Films Silicon Dioxide," Proceedings of the IEEE 1989 International Conference on Microelectonic Test Structures vol. 2, No. 1, Mar. 1989, pp. 121-124. cited by other.
Strauss, Karl F. et al., "Overvview of Radiation Tolerant unlimited Write Cycle Non-Volatile Memory," IEEE 2000. cited by other.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999. cited by other.
Wicker, Guy et al., Nonvolatile, High Density, High Performance Phase Change Memory, 1999, http://klabs.org/richcontent/MAPLDCon99/Papers/P21.sub.—Tyson.sub.—P.PD- DF#search='nonvolatile%20density%20high%20performance%20phase%20-change%20m- emory',8 pages. cited by other.
Wicker, Guy, "A Comprehensive Model of Submicron Chalcogenide Switching Devices," Doctoral Dissertation, Wayne State University, Detroit, MI, 1996. cited by other.
Wolf, Stanley, Excerpt from: Silicon Processing for the VLSI Era-vol. 4, pp. 674-679, 2004. cited by other.
Yi, J. H. et al. "Novel Cell Structure of PRAM with Thin Metal Layer Inserted GeSbTe," IEEE IEDM 2003, 4 pages. cited by other.

Yonehara, T. et al., "Control of Grain Boundary Location by Selective Nucleation OVer Amorphous Substrates," Mat. Res. Soc. Symp. Proc., vol. 106, 1998, pp. 21-26. cited by other.

Ahn, S. J. et al., "Highly Reliable 5nm Contact Cell Technology for 256Mb PRAM," VLSI Technology, Digest of Technical Papers, Jun. 14-16, 2005, pp. 98-99. cited by other.

Gibson, G.A. et al., "Phase-change Recording Medium that nables Ultrahigh-density Electron-beam Data Storage," Applied Physics Letter, 2005, 3 pp., vol. 86. cited by other.

Happ, T.D. et al., "Novel None-Mask Self-Heating Pillar Phase Change Memory," 2006 Symposium on VLSI Technology, 2 pp. cited by other.

Hudgens, S. et al., "Overview of Phase-Change Chalcogenide Nonvolatile Memory Technology," MRS Bulletin, Nov. 2004, pp. 829-832. cited by other.

"Magnetic Bit Boost," www.sciencenews.org <http://www.sciencenews.org>, Dec. 18 & 25, 2004, p. 389, vol. 166. cited by other.

"New Memories Tap Spin, Grid for Battle," Science News, Apr. 3, 1999, p. 223, vol. 155. cited by other.

Pirovani, Agostino et al., "Reliability Study of Phase-Change Nonvolatile Memories," IEEE Transactions on Device and Materials Reliability, Sep. 2004, pp. 422-427, vol. 4, No. 3, cited by other.

Radaelli, A. et al., "Electronic Switching Effect and Phase-Change Transition in Chalcogenide Materials," IEEE Electron Device Letters, Oct. 2004, pp. 684-686, vol. 25, No. 10. cited by other.

"Remembering on the Cheap," www.sciencenews.org <http://wwwsciencenews.org>, Mar. 19, 2005, p. 189, vol. 167. cited by other.

Wuttig, Matthias, "Towards a Universal Memory?"Nature Materials, Apr. 2005, pp. 265-266, vol. 4. cited by other.

Yamada, Noboru, "Potential of Ge-Sb-Te phase-change optical disks for high-data-rate recording in the near future," (Conference Proceedings Paper), Jul. 30, 1997, vol. 3109, 10 pages.

* cited by examiner

PHASE CHANGE MEMORY CELL WITH FIRST AND SECOND TRANSITION TEMPERATURE PORTIONS

CROSS-REFERENCE TO RELATED APPLICATIONS

This application is a continuation of co-pending U.S. patent application Ser. No. 11/424,177, filed on 14 Jun. 2006, which application claims the benefit of U.S. Provisional Patent Application No. 60/740,176 entitled "Phase Change Memory Cell and Manufacturing Method" filed on 28 Nov. 2005, both of which are incorporated by reference for all purposes.

PARTIES TO A JOINT RESEARCH AGREEMENT

International Business Machines Corporation, a New York corporation; Macronix International Corporation, Ltd., a Taiwan corporation, and Infineon Technologies AG, a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, and referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meets tight specifications needed for large-scale memory devices. It is desirable therefore to provide a memory cell structure having small dimensions and low reset currents, and a method for manufacturing such structure that meets tight process variation specifications needed for large-scale memory devices.

SUMMARY OF THE INVENTION

A phase change random access memory PCRAM device is described suitable for use in large-scale integrated circuits.

A first aspect of the invention is directed to a phase change memory cell, the memory cell being a part of a phase change memory device. The memory cell includes first and second electrodes having generally coplanar surfaces spaced apart by a gap and a phase change bridge electrically coupling the first and second electrodes. At least a section of the phase change bridge comprises a higher transition temperature bridge portion and a lower transition temperature portion. The lower transition temperature portion comprises a phase change region which can be transitioned, by the passage of electrical current therethrough, from generally crystalline to generally amorphous states at a lower temperature than the higher transition temperature portion. In some embodiments the section of the phase change bridge comprises first and second of the higher transition temperature portion located on different sides of the lower transition temperature portion. The phase change bridge may extend over the generally coplanar surfaces on the first and second electrodes and across the gap.

A second aspect of the invention districts to a method for making a phase change memory cell, the memory cell being a part of a phase change memory device, comprising electrically coupling first and second generally coplanar surfaces of first and second electrodes with a phase change bridge, the phase change bridge comprising phase change material. The electrically coupling step comprises providing a higher transition temperature portion and a lower transition temperature portion, the lower transition temperature portion creating a phase change region which can be transitioned between generally crystalline and generally amorphous states by the passage of electrical current between the electrodes. In some embodiments the providing step comprises changing the transition temperature of the phase change material of at least a section of the phase change bridge to create the higher transition temperature portion and the lower transition temperature portion by implanting a part of the section of the phase change bridge with a material to increase the transition temperature of said part thereby creating the higher transition temperature portion.

The method described herein for formation of the bridge for use in a memory cell in the PCRAM, can be used to make a very small bridge for other uses. Nano-technology devices with very small bridge structures are provided using materials other than phase change to materials, like metals, dielectrics, organic materials, semiconductors, and so on.

Various features and advantages of the invention will appear from the following description in which the preferred embodiments have been set forth in detail in conjunction with the accompanying drawings.

DETAILED DESCRIPTION

Figure 1:
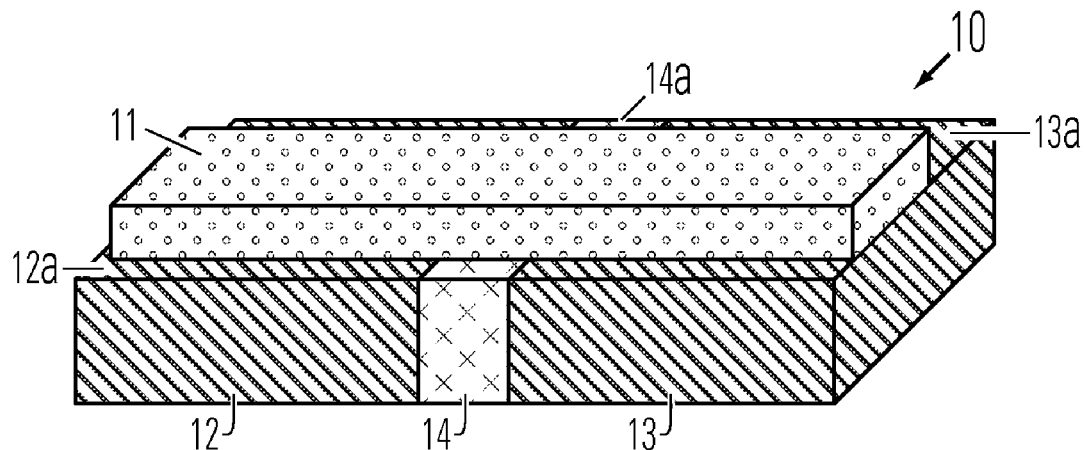
FIG. 1 illustrates an embodiment of a thin film bridge phase change memory element.

A detailed description of thin film fuse phase change memory cells, arrays of such memory cells, and methods for manufacturing such memory cells, is provided with reference to FIGS. 1-23. The embodiments of FIGS. 24-31 are examples of phase change memory cells having higher and lower transition temperature portions.

The following description of the invention will typically be with reference to specific structural embodiments and methods. It is to be understood that there is no intention to limit the invention to the specifically disclosed embodiments and methods but that the invention may be practiced using other features, elements, methods and embodiments. Like elements in various embodiments are commonly referred to with like reference numerals.

FIG. 1 illustrates a basic structure of a memory cell 10 including a bridge 11 of memory material on an electrode layer which comprises a first electrode 12, a second electrode 13, and an insulating member 14 between the first electrode 12 and the second electrode 13. As illustrated, the first and second electrodes 12, 13 have top surfaces 12a and 13a. Likewise the insulating member 14 has a top surface 14a. The top surfaces 12a, 13a, 14a of the structures in the electrode layer define a substantially planar top surface for the electrode layer in the illustrated embodiment. The bridge 11 of memory material lies on the planar top surface of the electrode layer, so that contacts between the first electrode and the bridge 11 and between the second electrode 13 and the bridge 11 are made on the bottom side of the bridge 11.

Figure 2:
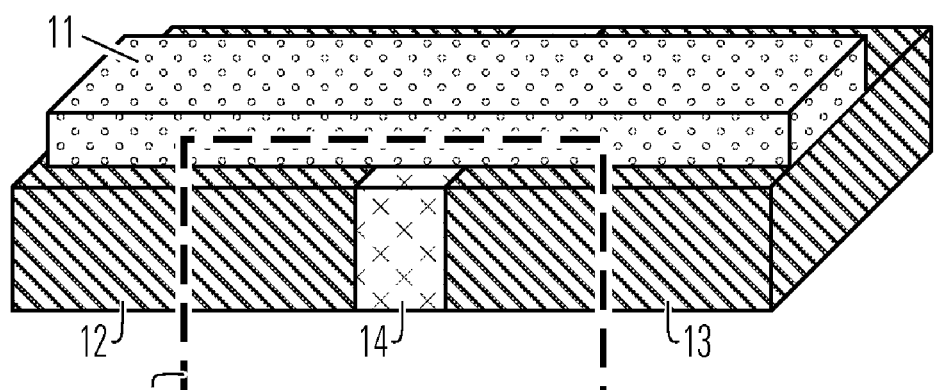
FIG. 2 illustrates a current path in a thin film bridge phase change memory element as shown in FIG. 1.

FIG. 2 shows a current path 15 between the first electrode 12, the bridge 11, and the second electrode 13 formed by the memory cell structure. Access circuitry can be implemented to contact the first electrode 12 and the second electrode 13 in a variety of configurations for controlling the operation of the memory cell, so that it can be programmed to set the bridge 11 in one of the two solid phases that can be reversibly implemented using the memory material. For example, using a chalcogenide-based phase change memory material, the memory cell may be set to a relatively high resistivity state in which at least a portion of the bridge in the current path is an amorphous state, and a relatively low resistivity state in which most of the bridge in the current path is in a crystalline state.

Figure 3:
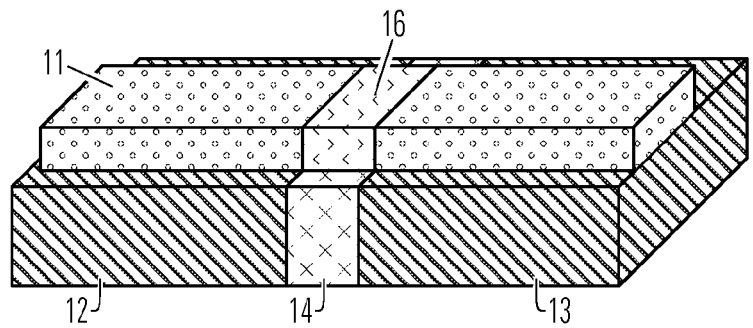
FIG. 3 illustrates an active region for phase changes in a thin film bridge phase change memory element as shown in FIG. 1.

FIG. 3 shows the active channel 16 in the bridge 11, where the active channel 16 is the region in which the material is induced to change between the at least two solid phases. As can be appreciated, the active channel 16 can be made extremely small in the illustrated structure, reducing the magnitude of current needed to induce the phase changes.

Figure 4:
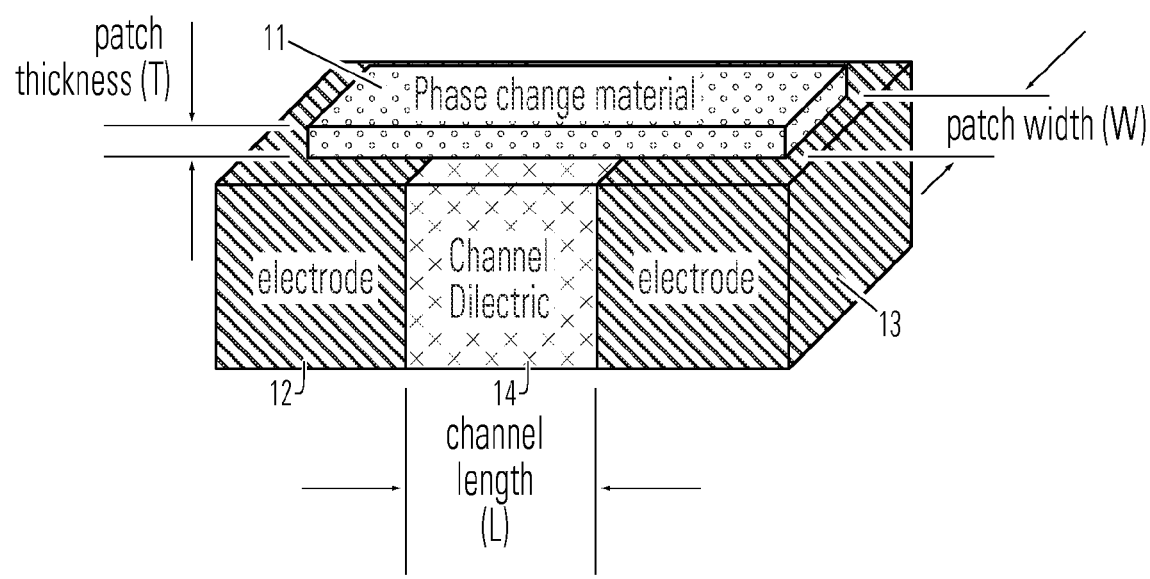
FIG. 4 illustrates dimensions for a thin film bridge phase change memory element as shown in FIG. 1.

FIG. 4 illustrates important dimensions of the memory cell 10. The length L (x-dimension) of the active channel is defined by the thickness of the insulating member 14 (called channel dielectric in the figure), between the first electrode 12 and the second electrode 13. This length L can be controlled by controlling the width of the insulating member 14 in embodiments of the memory cell. In representative embodiments, the width of the insulating member 14 can be established using a thin film deposition technique to form a thin sidewall dielectric on the side of an electrode stack. Thus, embodiments of the memory cell have a channel length L less than 100 nm. Other embodiments have a channel length L of about 40 nm or less. In yet other embodiments, the channel length is less than 20 nm. It will be understood that the channel length L can be even smaller than 20 nm, using thin film deposition techniques such as atomic layer deposition and the like, according to the needs of the particular application.

Likewise, the bridge thickness T (y-dimension) can be very small in embodiments of the memory cell. This bridge thickness T can be established using a thin film deposition technique on the top surfaces of the first electrode 12, insulating member 14, and second electrode 13. Thus, embodiments of the memory cell have a bridge thickness T about 50 nm or less. Other embodiments of the memory cell have a bridge thickness of about 20 nm or less. In yet other embodiments, the bridge thickness T is about 10 nm or less. It will be understood that the bridge thickness T can be even smaller than 10 nm, using thin film deposition techniques such as atomic layer deposition and the like, according to the needs of the particular application, so long as the thickness is sufficient for the bridge performs its purpose as memory element, having at least two solid phases, reversible by a current or by a voltage applied across the first and second electrodes.

As illustrated in FIG. 4, the bridge width W (z-dimension) is likewise very small. This bridge width W is implemented in preferred embodiments, so that it has a width less than 100 nm. In some embodiments, the bridge width W is about 40 nm or less.

Embodiments of the memory cell include phase change based memory materials, including chalcogenide based materials and other materials, for the bridge 11. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$ commonly referred to as GST.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including N2 doped GST, GexSby, or other material that uses different crystal phase changes to determine resistance; PrxCayMnO3, PrSrMnO, ZrOx, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse. Further examples of programmable resistive memory materials include GeSbTe, GeSb, NiO, Nb—SrTiO3, Ag—GeTe, PrCaMnO, ZnO, Nb2O5, Cr—SrTiO3.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

Figure 5:
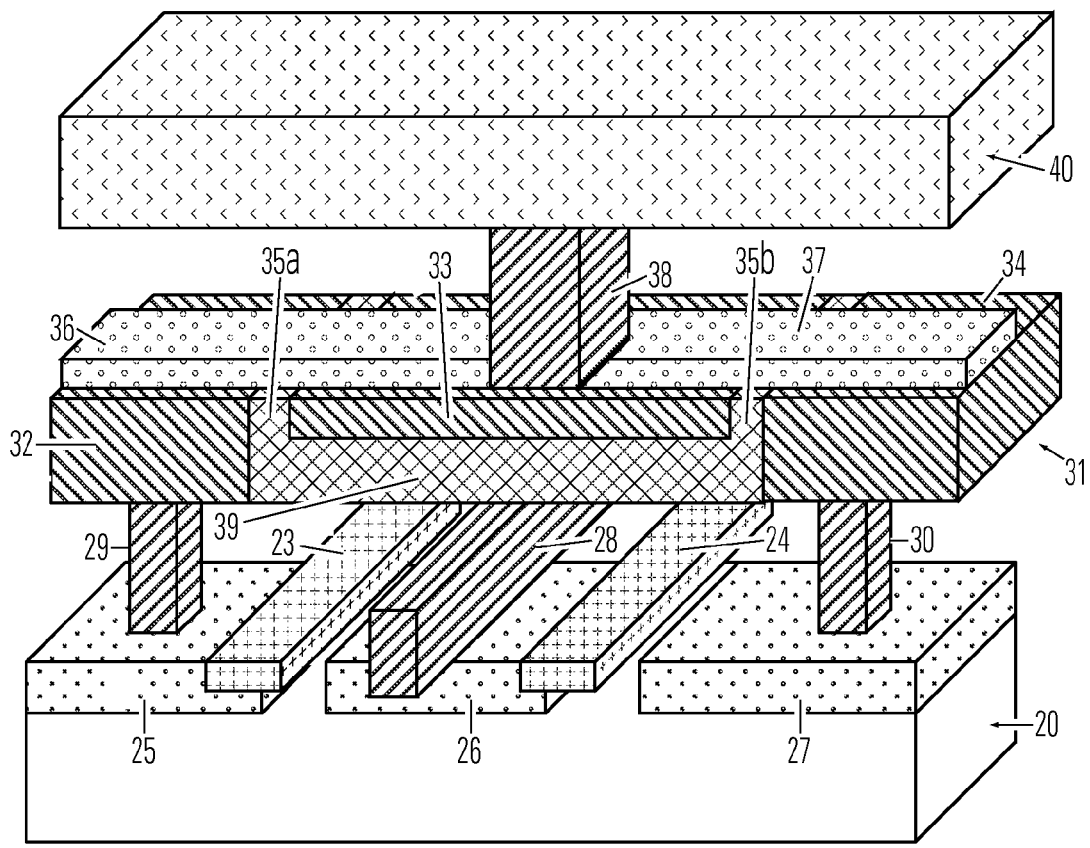
FIG. 5 illustrates a structure for a pair of phase change memory elements with access circuitry below an electrode layer and bit lines above the electrode layer.

FIG. 5 depicts a structure for PCRAM cells. The cells are formed on a semiconductor substrate 20. Isolation structures such as shallow trench isolation STI dielectrics (not shown) isolate pairs of rows of memory cell access transistors. The access transistors are formed by n-type terminal 26 acting as a common source region and n-type terminals 25 and 27 acting as drain regions in a p-type substrate 20. Polysilicon word lines 23 and 24 form the gates of the access transistors. A dielectric fill layer (not illustrated) is formed over the polysilicon word lines. The layer is patterned and conductive structures, including common source line 28 and plug structures 29 and 30 are formed. The conductive material can be tungsten or other materials and combinations suitable for the plug and lines structures. The common source line 28 contacts the source region 26, and acts as a common source line along a row in the array. The plug structures 29 and 30 contact the drain terminals 25 and 26, respectively. The fill layer (not shown), the common source line 28 and the plug structures 29 and 30, have a generally planar top surface, suitable for formation of an electrode layer 31.

The electrode layer 31 includes electrode members 32, 33 and 34, which are separated from one another by an insulating member including fences 35a and 35b formed for example by a sidewall process as described below, and base member 39. The base member 39 can be thicker than the fences 35a, 35b in embodiments of the structure, and separates the electrode member 33 from the common source line 28. For example the base member can be for instance, 80 to 140 nm thick while the fences are much narrower, as needed to reduce capacitive coupling between the source line 28 and the electrode member 33. The fences 35a, 35b comprise a thin film dielectric material on the sidewalls of electrode members 32, 34 in the illustrated embodiment, with a thickness at the surface of the electrode layer 31 determined by the thin film thickness on the sidewalls.

A thin film bridge 36 of memory material, such as GST, overlies the electrode layer 31 on one side traversing across the fence member 35a, forming a first memory cell, and a thin film bridge 37 of memory material, such as GST, overlies the electrode layer 31 on another side traversing across the fence member 35b, forming a second memory cell.

A dielectric fill layer (not illustrated) overlies the thin film bridges 36, 37. The dielectric fill layer comprises silicon dioxide, a polyimide, silicon nitride or other dielectric fill materials. In embodiments, the fill layer comprises a relatively good insulator for heat as well as for electricity, providing thermal and electrical isolation for the bridges. Tungsten plug 38 contacts the electrode member 33. A patterned conductive layer 40, comprising metal or other conductive material, including bit lines in an array structure, overlies the dielectric fill layer, and contacts the plug 38 to establish access to the memory cells corresponding to the thin film bridge 36 and the thin film bridge 37.

Figure 6:
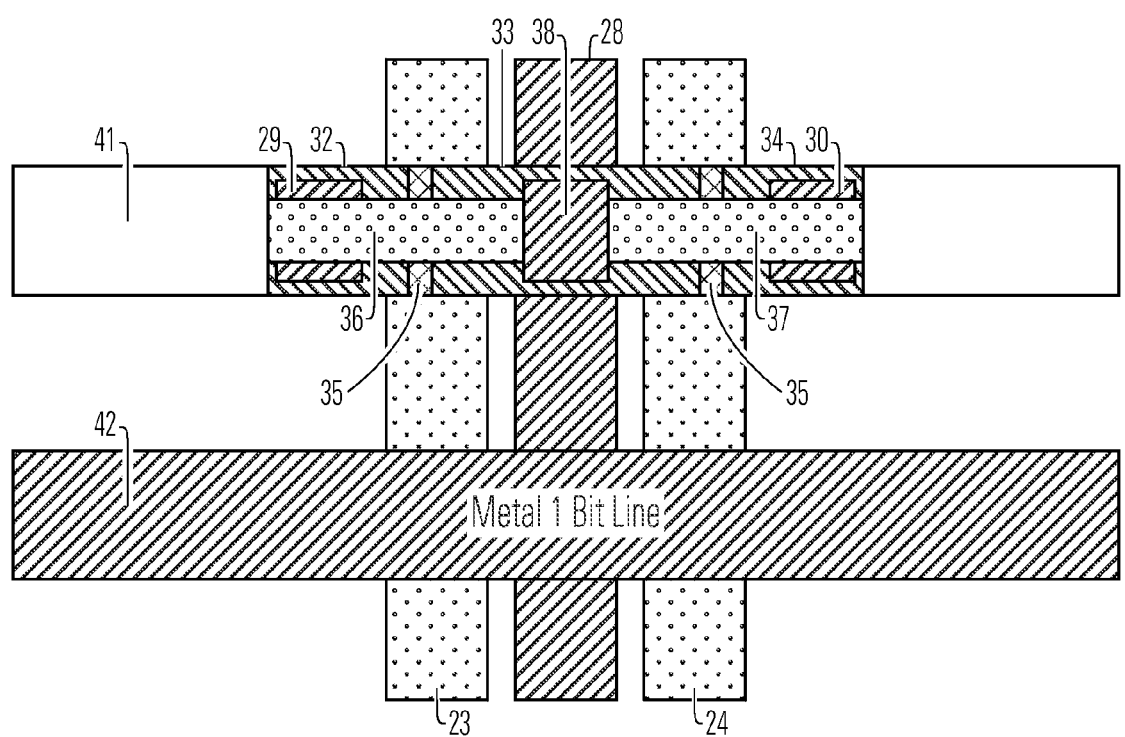
FIG. 6 shows a layout or plan view for the structure illustrated in FIG. 5.

FIG. 6 shows the structure above the semiconductor substrate layer 20 of FIG. 5 in layout view. Thus, the word lines 23 and 24 are laid out substantially parallel to the common source line 28, along those in an array of memory cells. Plugs 29 and 30 contact terminals of access transistors in the semiconductor substrate and the underside of electrode members 32 and 34 respectively. Thin film bridges 36 and 37 of memory material overlie the electrode members 32, 33 and 34, and the insulating fences 35a, 35b separating the electrode members. Plug 38 contacts the electrode member 33 between the bridges 36 and 37 and the underside of a metal bit line 41 (transparent in FIG. 6) in the patterned conductive layer 40. Metal bit line 42 (not transparent) is also illustrated in FIG. 6 to emphasize the array layout of the structure.

In operation, access to the memory cell corresponding with bridge 36 is accomplished by applying a control signal to the word line 23, which couples the common source line 28 via terminal 25, plug 29, and electrode member 32 to the thin-film bridge 36. Electrode member 33 is coupled via the contact plug 38 to a bit line in the patterned conductive layer 40. Likewise, access to the memory cell corresponding with bridge 37 is accomplished by applying a control signal to the word line 24.

It will be understood that a wide variety of materials can be utilized in implementation of the structure illustrated in FIGS. 5 and 6. For example, copper metallization can be used. Other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof. The inter-electrode fence members 35a, 35b may be silicon oxide, silicon oxynitride, silicon nitride, Al2O3, or other low K dielectrics. Alternatively, the inter-electrode insulating layer may comprise one or more elements selected from the group consisting of Si, Ti, Al, Ta, N, O, and C.

Figure 7:
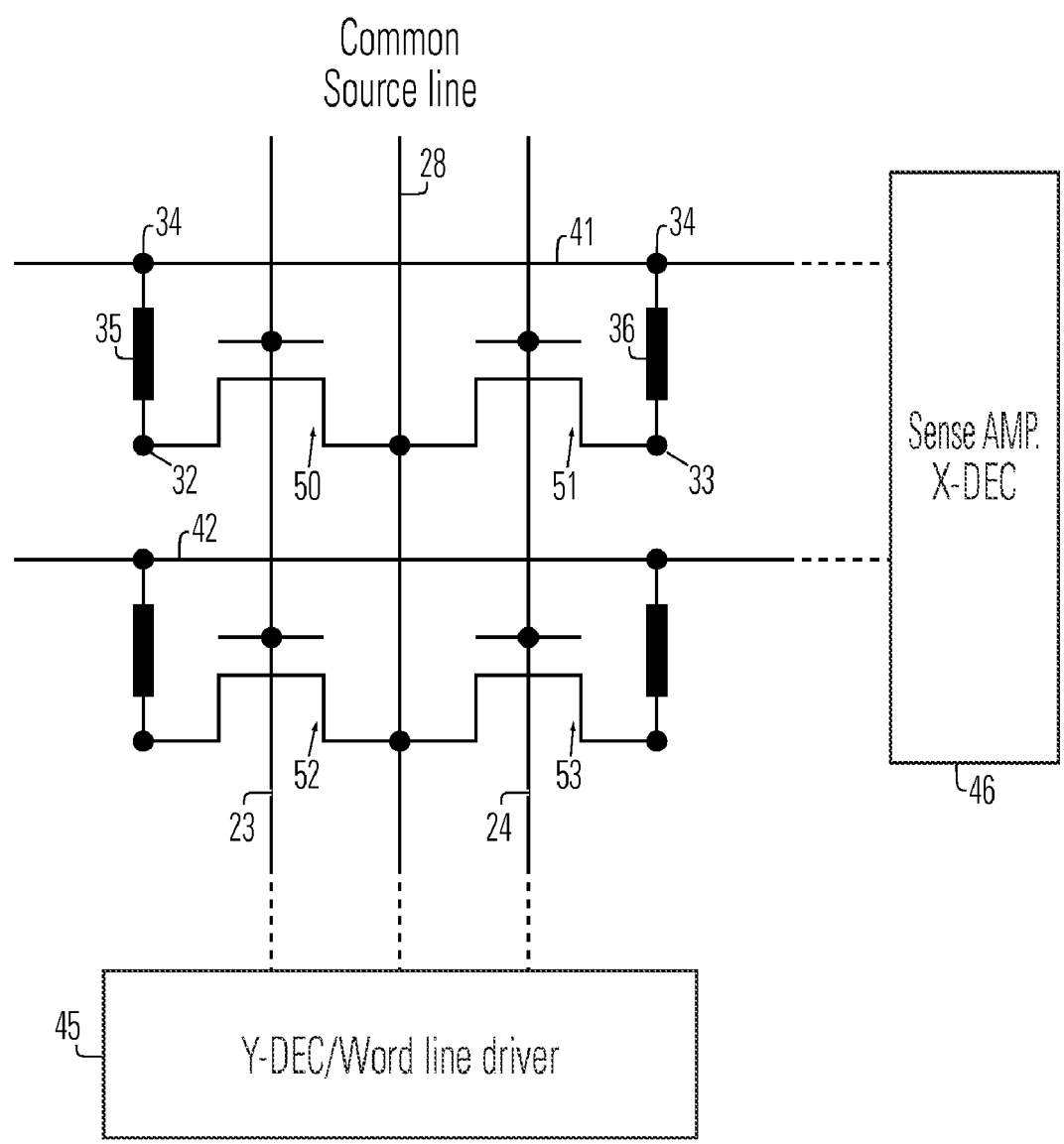
FIG. 7 is a schematic diagram for a memory array comprising phase change memory elements.

FIG. 7 is a schematic illustration of a memory array, which can be implemented as described with reference to FIGS. 5 and 6. Thus, reference numerals for elements of FIG. 7 match corresponding elements in the structure of FIGS. 5 and 6. It will be understood that the array structure illustrated in FIG. 7 can be implemented using other cell structures. In a schematic illustration of FIG. 7, the common source line 28, the word line 23 and the word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and set of sense amplifiers in block 46 are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the electrode member 32 for bridge 36, which is in turn coupled to electrode member 34. Likewise, the drain of access transistor 51 is coupled to the electrode member 33 for bridge 36, which is in turn coupled to the electrode member 34. The electrode member 34 is coupled to the bit line 41. For schematic purposes, the electrode member 34 is illustrated at separate locations on the bit line 41. It will be appreciated that separate electrode members can be utilized for the separate memory cell bridges in other embodiments. Access transistors 52 and 53 are coupled to corresponding memory cells as well on line 42. It can be seen that the common source line 28 is shared by two rows of memory cells, where a row is arranged in the Y-direction in the illustrated schematic. Likewise, the electrode member 34 is shared by two memory cells in a column in the array, where a column is arranged in the X-direction in the illustrated schematic.

Figure 8:
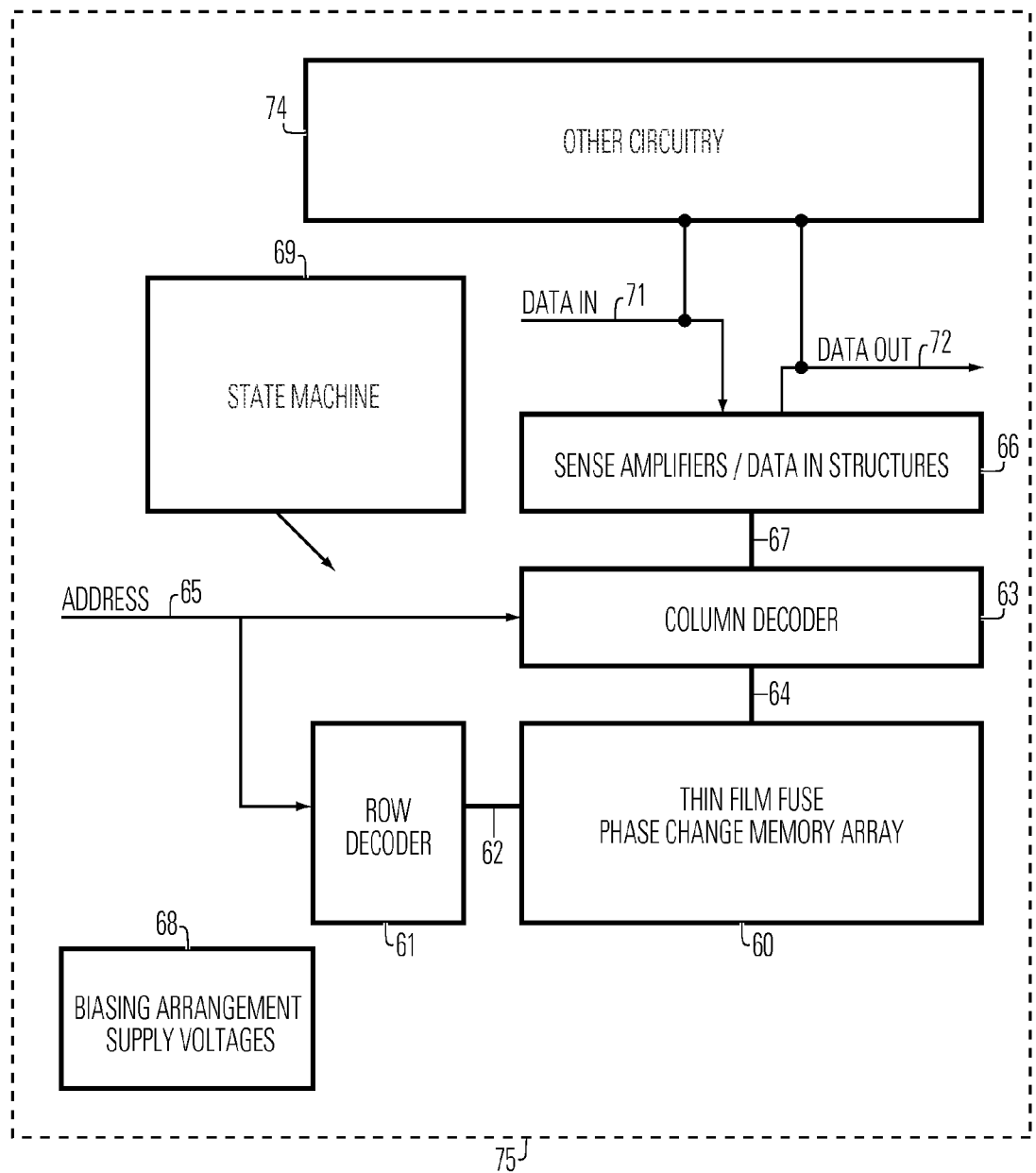
FIG. 8 is a block diagram of an integrated circuit device including a thin film fuse phase change memory array and other circuitry.

FIG. 8 is a simplified block diagram of an integrated circuit according to an embodiment of the present invention. The integrated circuit 74 includes a memory array 60 implemented using thin film fuse phase change memory cells, on a semiconductor substrate. A row decoder 61 is coupled to a plurality of word lines 62, and arranged along rows in the memory array 60. A column decoder 63 is coupled to a plurality of bit lines 64 arranged along columns in the memory array 60 for reading and programming data from the multiple-gate memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 9:
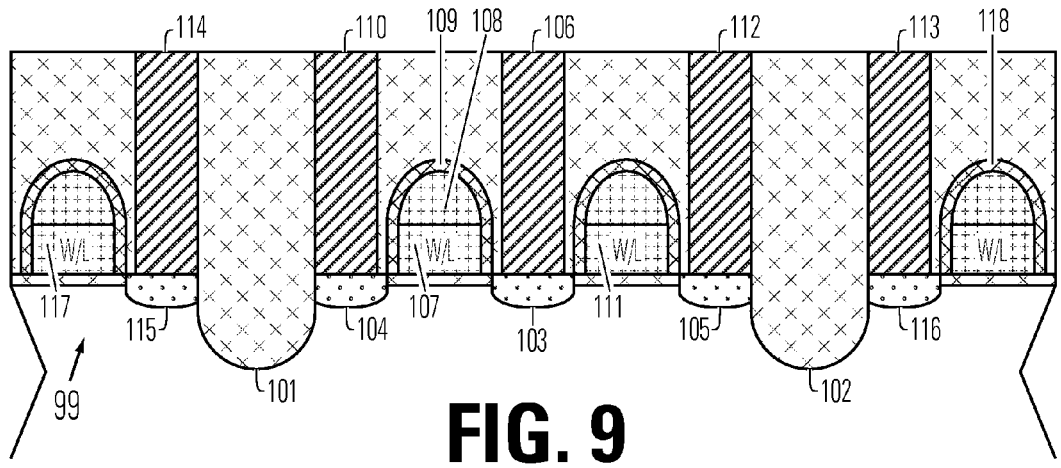
FIG. 9 is a cross-section of a substrate that includes access circuitry formed by front-end-of-line processes, made in a process for manufacturing a phase change memory device based on the structure shown in FIG. 5.

FIG. 9 illustrates a structure 99 after front-end-of-line processing, forming the standard CMOS components in the illustrated embodiment corresponding to the word lines, the source line, and the access transistors in the array shown in FIG. 7. In FIG. 9, source line 106 overlies doped region 103 in the semiconductor substrate, where the doped region 103 corresponds with the source terminal of a first access transistor on the left in the figure, and of a second access transistor on the right in the figure. In this embodiment, the source line 106 extends to the top surface of the structure 99. In other embodiments the source line does not extend all the way to the surface. Doped region 104 corresponds with the drain terminal of the first access transistor. A word line including polysilicon 107, and silicide cap 108, acts as the gate of the first access transistor. Dielectric layer 109 overlies the polysilicon 107 and silicide cap 108. Plug 110 contacts doped region 104, and provides a conductive path to the surface of the structure 99 for contact to a memory cell electrode as described below. The drain terminal of the second access transistor is provided by doped region 105. A word line including polysilicon line 111, and the silicide cap (not labeled) acts as the gate for the second access transistor. Plug 112 contacts doped region 105 and provides a conductive path to the top surface of the structure 99 for contact to a memory cell electrode as described below. Isolation trenches 101 and 102 separate the two-transistor structure coupled to the plugs 110 and 112, from adjacent two-transistor structures. On the left, word line polysilicon 117 and plug 114 are shown. On the right, word line polysilicon 118 and plug 113 are shown. The structure 99 illustrated in FIG. 9 provides a substrate for formation of memory cell components, including the first and second electrodes, and the bridge of memory material, as described in more detail below.

Figure 10:
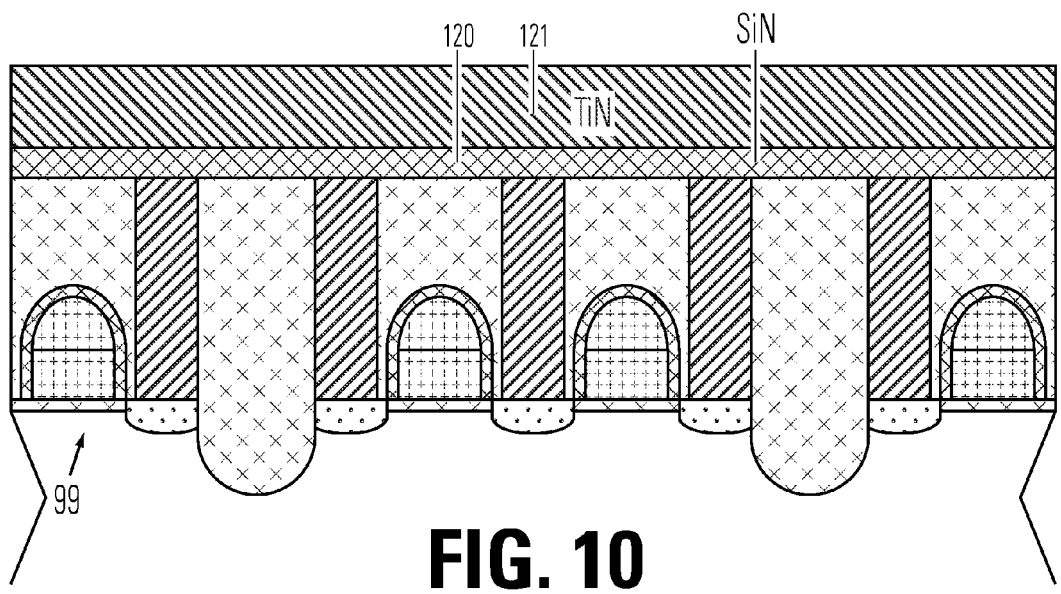
FIG. 10 is a cross-section showing initial steps in formation of an electrode layer for the structure shown in FIG. 5.

FIG. 10 illustrates a next stage in the process, in which a thin dielectric layer 120 comprising silicon nitride SiN or other material, is formed on the surface of the structure 99. Then a layer 121 of conductive electrode material such as titanium nitride TiN is formed on the dielectric layer 120.

Figure 11A:
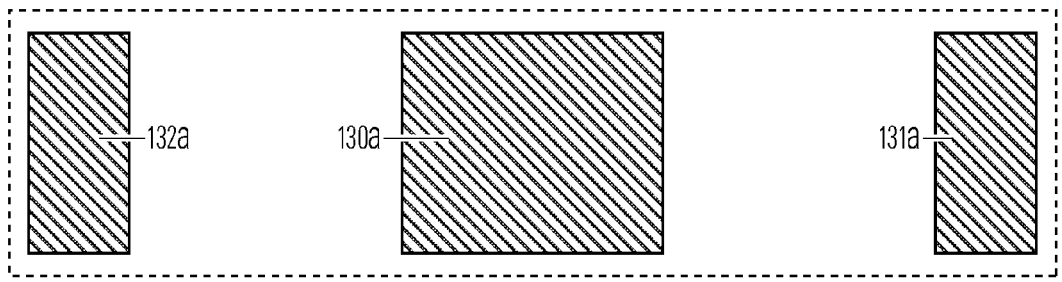
FIGS. 11A and 11B show layout and cross-sectional views for patterning the structure of FIG. 10, forming electrode stacks in the electrode layer for the structure shown in FIG. 5.
Figure 11B:
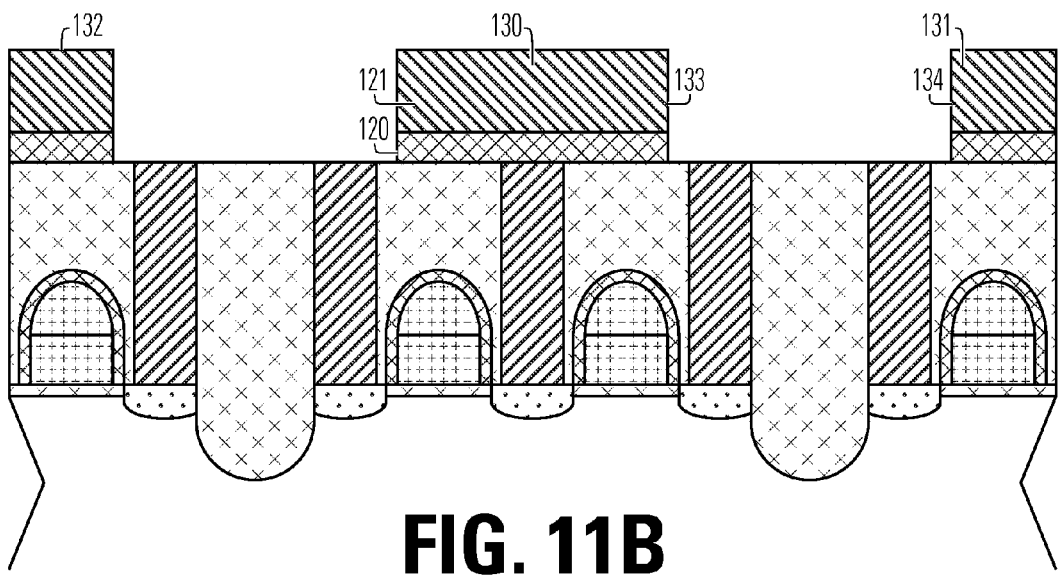

FIGS. 11A and 11B illustrate a next stage in the process, in which the conductive electrode layer 121 and the dielectric layer 120 are patterned to define electrode stacks 130, 131 and 132 on the surface of the structure 99. In an embodiment, the electrode stacks are defined by a mask lithographic step that produces a patterned layer of photoresist, followed by dimension measurement and verification steps known in the art, and then etching of the TiN and SiN used for formation of the layers 121 and 120. The stacks have sidewalls 133 and 134.

Figure 12:
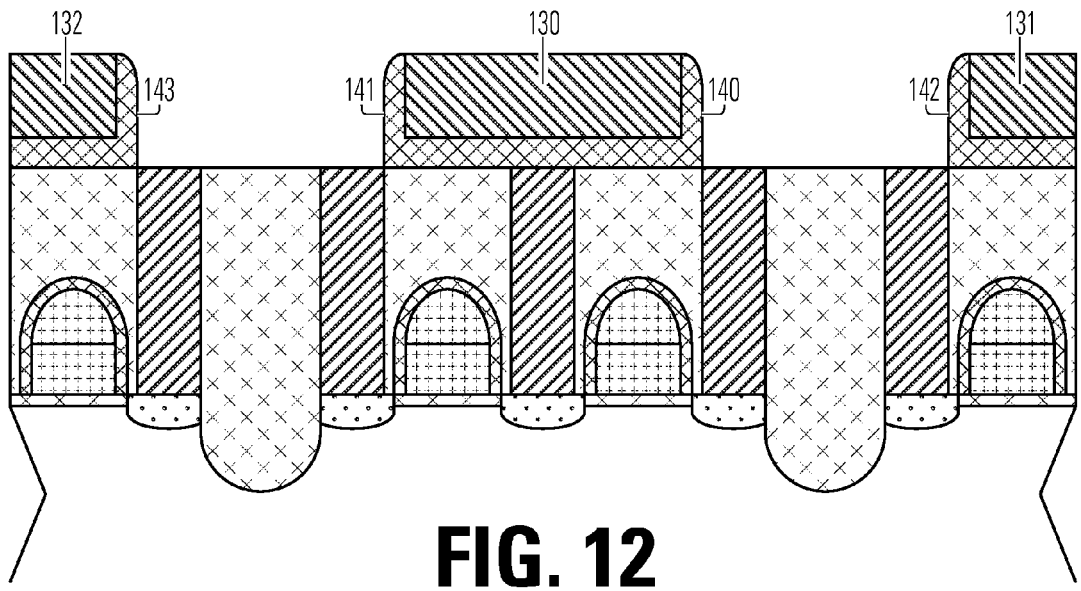
FIG. 12 shows a cross-sectional view corresponding to steps for formation of sidewall insulators on the electrode stacks of FIG. 11B.

FIG. 12 illustrates a next stage in the process, in which dielectric sidewalls 140, 141, 142 and 143 are formed on the sidewalls of the stacks 130, 131, 132, by forming a thin film dielectric layer (not shown) that is conformal with the stacks and the sidewalls of the stacks, and then anisotropically etching the thin film dielectric to remove it from the regions between the stacks and on the surfaces of the stacks, while remaining on the sidewalls. In embodiments of the process, the material used for formation of the sidewalls 140, 141, 142 and 143 comprises SiN or other dielectric material, such as silicon dioxide, silicon oxynitride, aluminum oxide, and the like.

Figure 13:
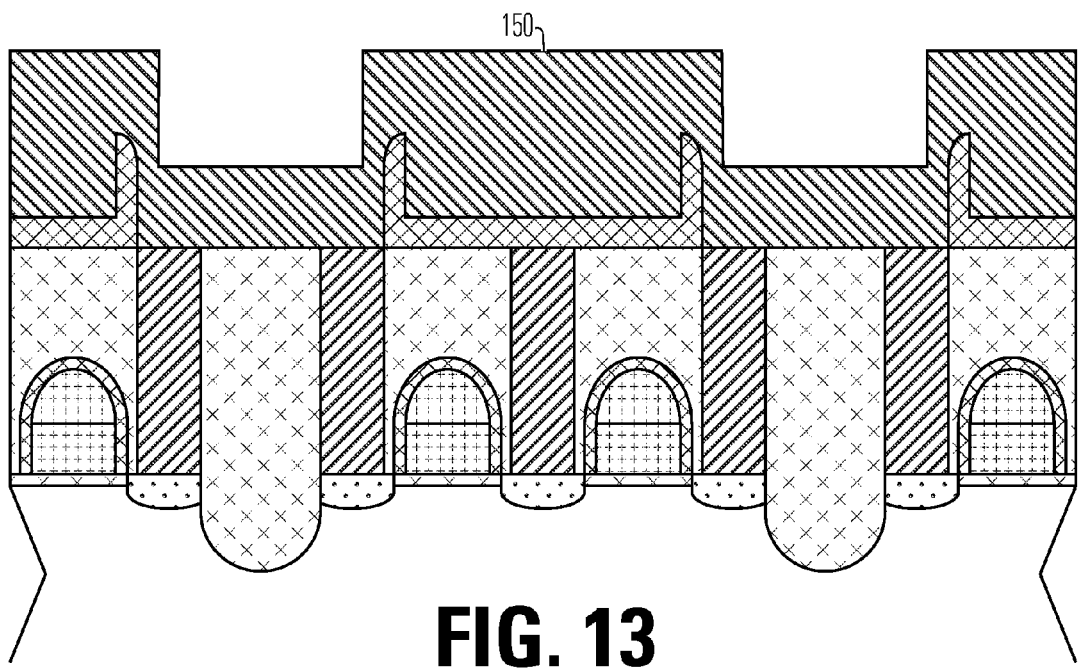
FIG. 13 shows a cross-sectional view corresponding to steps for formation of a layer of conductor material over the structure of FIG. 12.

FIG. 13 illustrates a next stage in the process, in which a second electrode material layer 150 is formed over the stacks 130, 131 132 and the sidewalls 140, 141, 142, 143. The electrode material layer 150 comprises TiN or other suitable conductive material, such as TaN, aluminum alloys, copper alloys, doped polysilicon, etc.

Figure 14:
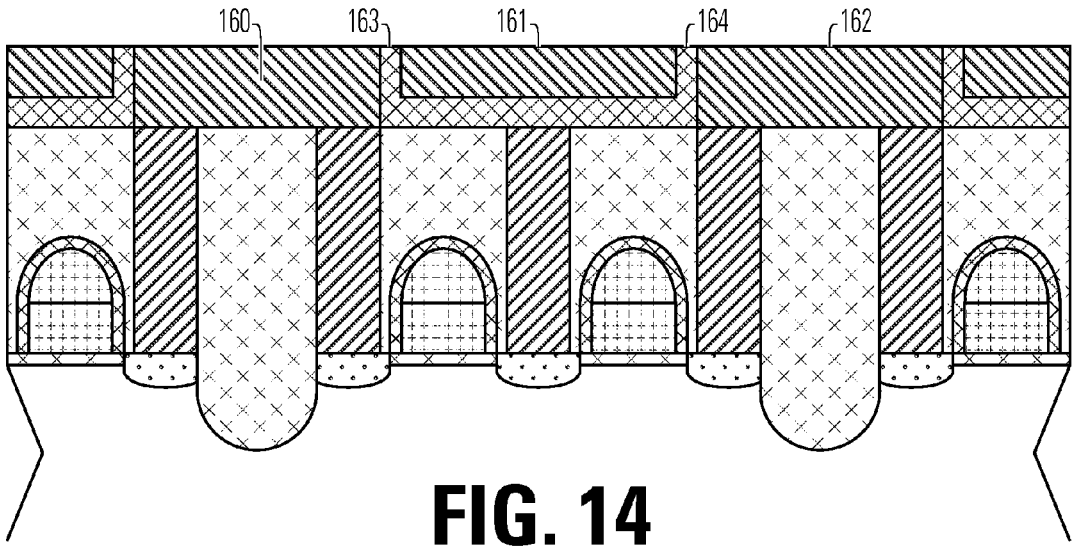
FIG. 14 shows a cross-sectional view corresponding to steps for polishing the conductive material and sidewall insulators in the structure of FIG. 13.

FIG. 14 illustrates a next stage in the process, in which the second electrode material layer 150, the sidewalls 140, 141, 142, 143 and the stacks 130, 131, 132 are etched and planarized to define an electrode layer over the substrate provided by structure 99. Embodiments of the process for polishing include a chemical mechanical polishing process, followed by brush clean and liquid and or gas clean procedures, as known in the art. The electrode layer includes electrode members 160, 161, 162, and insulating members 163 and 164 in between them. The electrode layer in the illustrated embodiment has a substantially planar top surface. In the embodiment shown, the insulating members 163 and 164 comprise portions of a structure which also extends beneath electrode member 161, isolating it from the source line. Other example structures may use different materials for the electrode members and insulating members.

Figure 15:
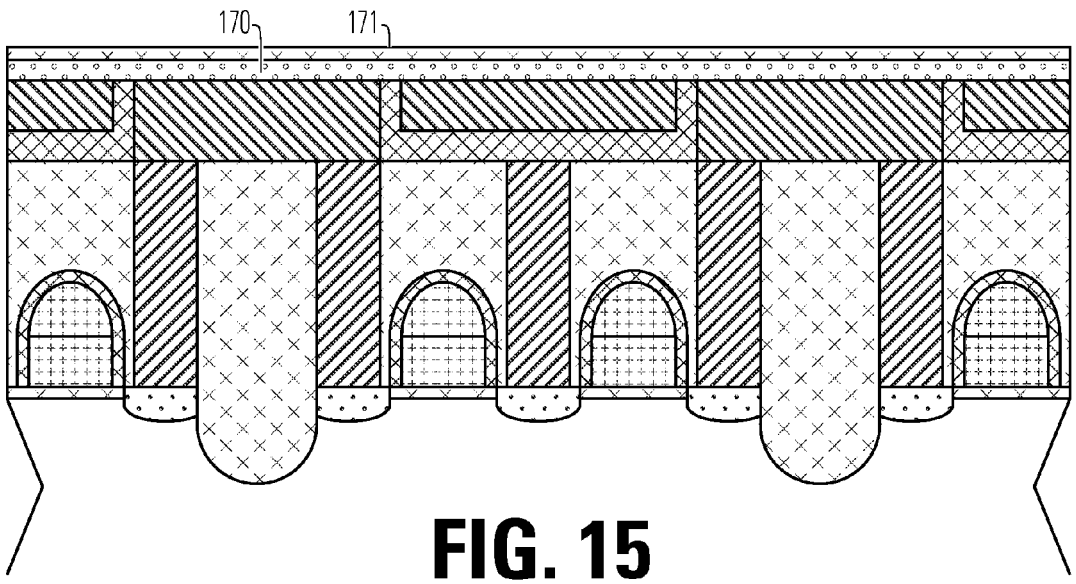
FIG. 15 shows a cross-sectional view corresponding to steps for forming a thin film layer of phase change material and a protective cap layer on the structure of FIG. 14.

FIG. 15 illustrates a next stage in the process, in which a thin film layer 170 of a phase change based memory material is formed on the substantially planar top surface of the electrode layer. The memory material is deposited using sputtering without collimation at about 250 degrees C. This results in a thin film having a thickness of about 60 nanometers or less, when using Ge2Sb2Te5 as the phase change memory material. Embodiments involve sputtering the entire wafer to thickness of about 40 nanometers on the flat surfaces. The thin film layer 170 has a thickness less than 100 nm in some embodiments, and more preferably 40 nm or less. In embodiments of the memory device, the thin film layer 170 has a thickness of less than 20 nm, such as 10 nm. After forming the thin film layer 170, a protective cap layer 171 is formed. The protective cap layer 171 comprises a low-temperature deposited silicon dioxide or other dielectric material formed over the thin film layer 170. The protective cap layer 171 is preferably a good electrical insulator and a good thermal insulator, and protects the memory material from exposure in subsequent steps, such photoresist stripping steps which can damage the material. The process involves formation of a low-temperature liner dielectric, such as a silicon nitride layer or silicon oxide layer, using a process temperature less than about 200 degrees C. One suitable process is to apply silicon dioxide using PECVD. After formation of the protective cap layer 171, a dielectric fill over the memory material can be implemented using a higher temperature process such as high-density plasma HDP CVD.

Figure 16A:
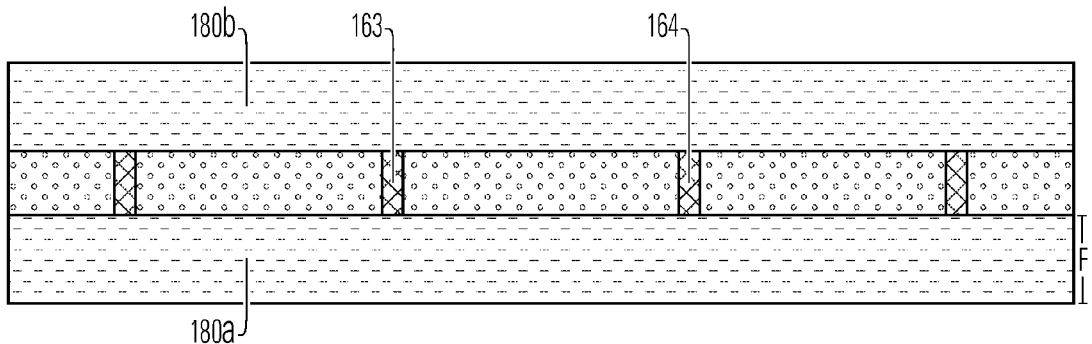
FIGS. 16A and 16B show layout and cross-sectional views for patterning the thin film layer of phase change material of FIG. 15, forming strips of photoresist on the phase change material.
Figure 16B:
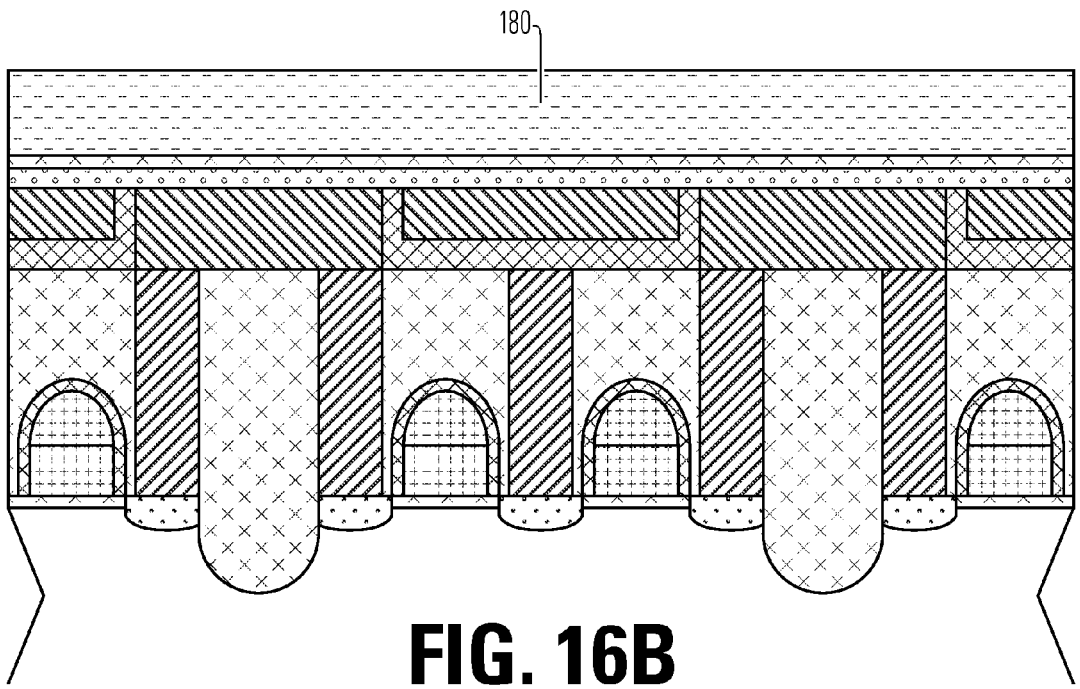

FIGS. 16A and 16B illustrate a next stage in the process, in which a photoresist layer 180 is formed and patterned in a mask lithographic process to define strips 180*a*, 180*b* over the thin film layer 170 and protective cap layer 171. As seen in FIG. 16A, the insulating members 163 and 164 are exposed between the strips 180*a*, 180*b* of photoresist. The strips of photoresist are made as narrow as possible according to the lithographic process applied. For example, the strips have a width equal to the minimum feature size F for the lithographic process used, where the minimum feature size for a process may be on the order of 0.2 microns (200 nm), 0.14 microns, or 0.09 microns in current mask lithographic processes. Obviously, embodiments of the process can be adapted to narrower minimum feature sizes as lithographic processes advance.

Figure 17A:
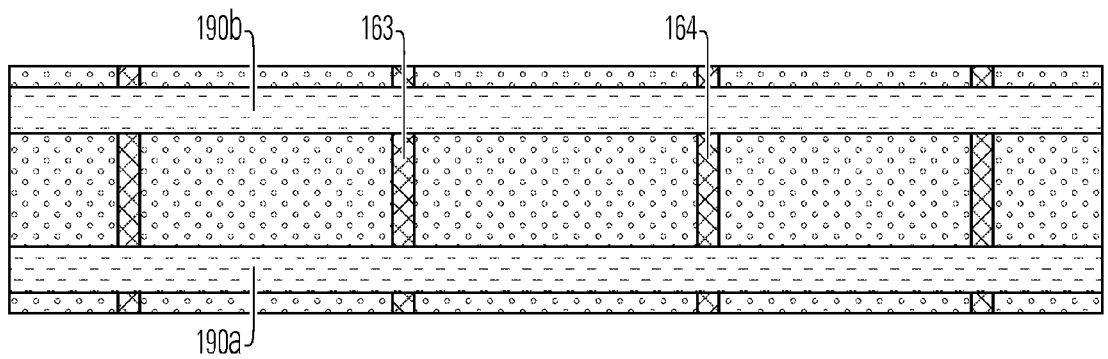
FIGS. 17A and 17B show layout and cross-sectional views for patterning the thin film layer of phase change material of FIG. 15, after etching the strips of photoresist of FIGS. 16A and 16B to form narrow strips of photoresist.
Figure 17B:
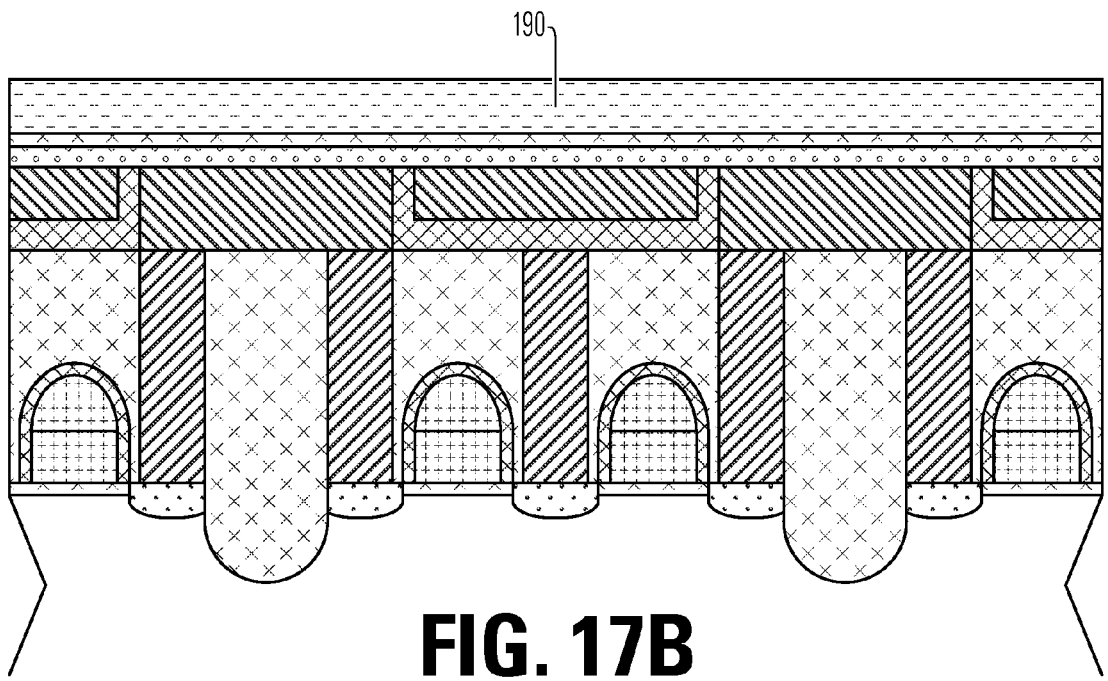

FIGS. 17A and 17B illustrate a next stage in the process, in which the photoresist strips 180*a*, 180*b* of FIG. 16A are trimmed to form more narrow photoresist strips 190*a*, 190*b*. As shown in FIG. 17B, the trimmed photoresist 190 is also thinner than the photoresist layer 180 of FIG. 16B. In one embodiment, the photoresist strips are trimmed by isotropic etching using a reactive ion etch process or otherwise. The etching trims the photoresist strips to more narrow line widths. Embodiments of the more narrow photoresist strips 190*a*, 190*b* are less than 100 nm wide. In other embodiments the more narrow photoresist strips 190*a*, 190*b* are about 40 nm or less wide. Photoresist trimming is applied using an oxide plasma to isotropically etch the photoresist, which trims its width and thickness down to a width of for example about 40 nanometers in a 0.09 micron (90 nanometer) minimum feature size lithographic process environment. In an alternative, a hard mask layer, such as a low temperature deposited layer of SiN or SiO2 can be put on the bottom of the photoresist pattern to prevent etching damage of the memory material during the photoresist stripping process.

Figure 18A:
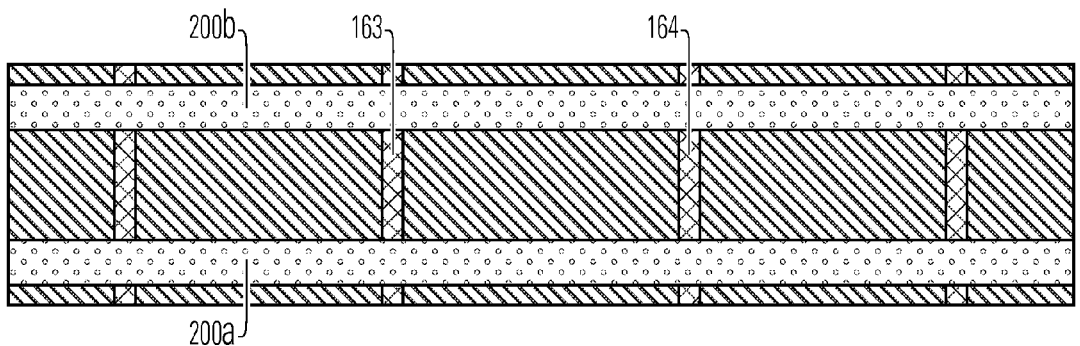
FIGS. 18A and 18B show layout and cross-sectional views of the strips of phase change material after etching the thin film layer of phase change material according to the pattern of photoresist shown in FIGS. 17A and 17B.
Figure 18B:
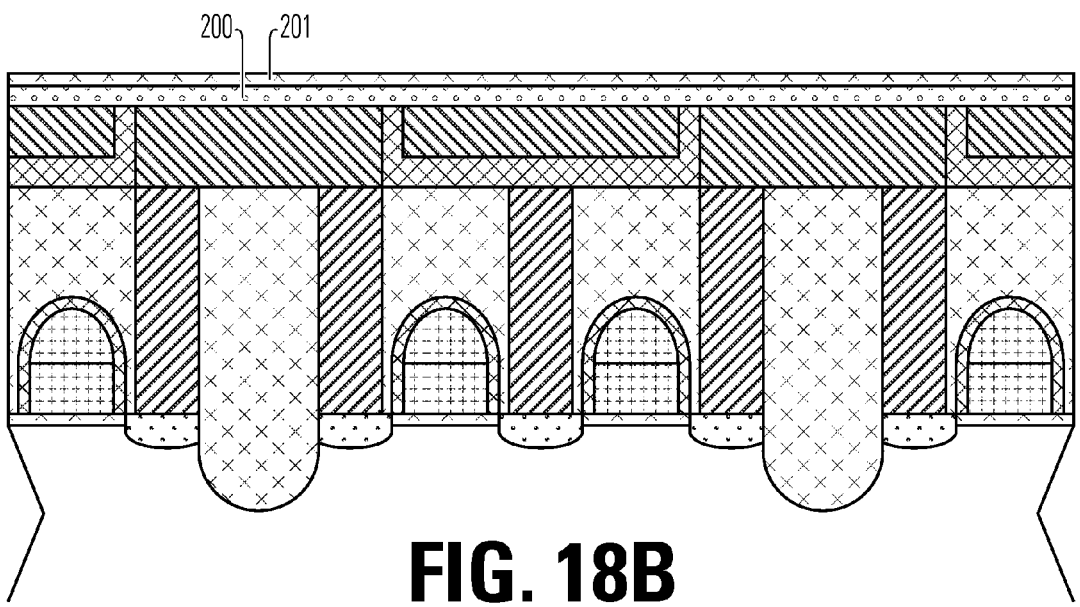

FIGS. 18A and 18B illustrate a next stage in the process, in which the more narrow photoresist strips 190*a*, 190*b* are used for an etch mask, and the thin film layer 200 of memory material is etched to lithographically define strips 200*a*, 200*b* of memory material, with or without the protective cap layer 201. As shown, the strips 200*a*, 200*b* span across the insulating members 163, 164, and the electrode members in the electrode layer. In embodiments of the process the memory material comprises a GST chalcogenide based material, and is etched using for example, a chlorine-based or fluorine-based, reactive ion etching process.

Figure 19A:
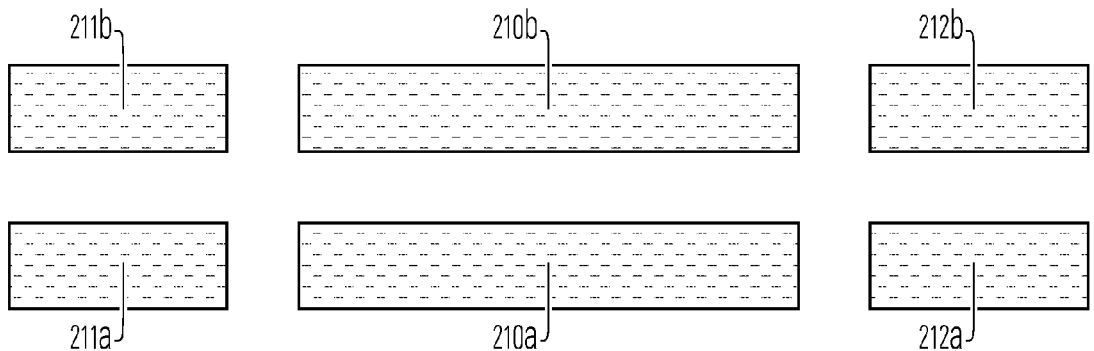
FIGS. 19A and 19B show layout and cross-sectional views for patterning the strips of phase change material of FIGS. 18A and 18B, used to form bridges of phase change material on the electrode layer.
Figure 19B:
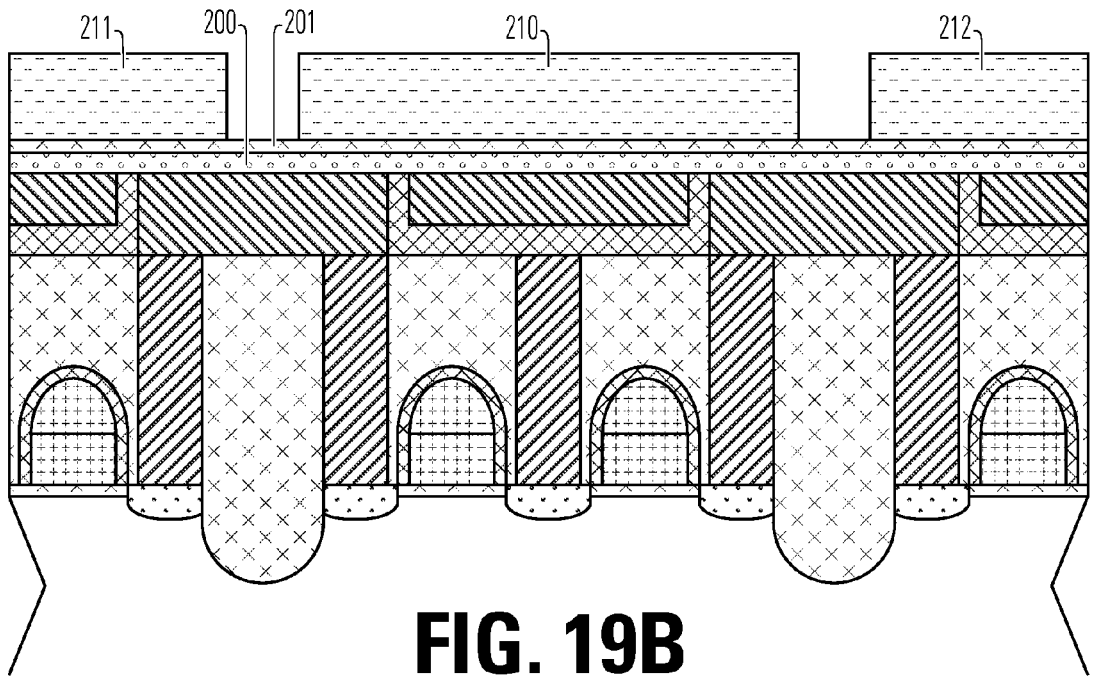

FIGS. 19A and 19B illustrate a next stage in the process, in which another photoresist layer 210, 211 is formed and patterned to define photoresist structures 210*a*, 210*b*, 211*a*, 211*b*, 212*a* and 212*b*. The cell structures correspond with pairs of memory cells as described below. The cell structures are wider than the strips 200*a*, 200*b* of memory material because they have a width equal to the width achieved using the lithographic process applied in the manufacturing process, such as a photomask based lithographic process, without trimming. Thus, the width in some embodiments is equal to the minimum feature size F for the lithographic process applied in forming the layer.

Figure 20A:
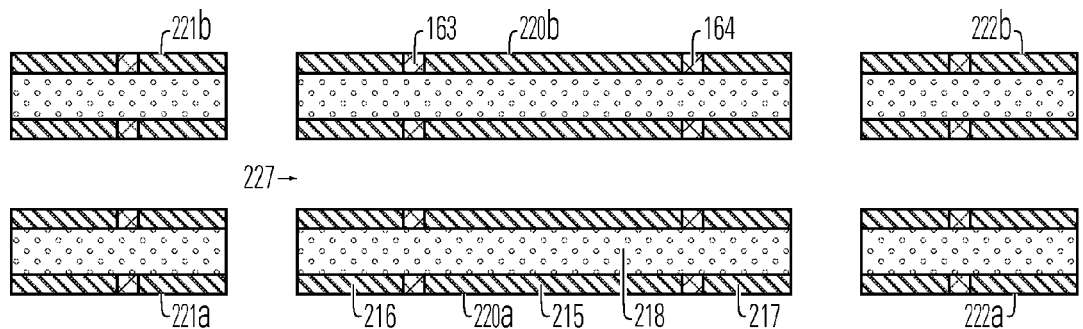
FIGS. 20A and 20B show layout and cross-sectional views of the bridges of phase change material after etching according to the pattern of FIGS. 19A and 19B.
Figure 20B:
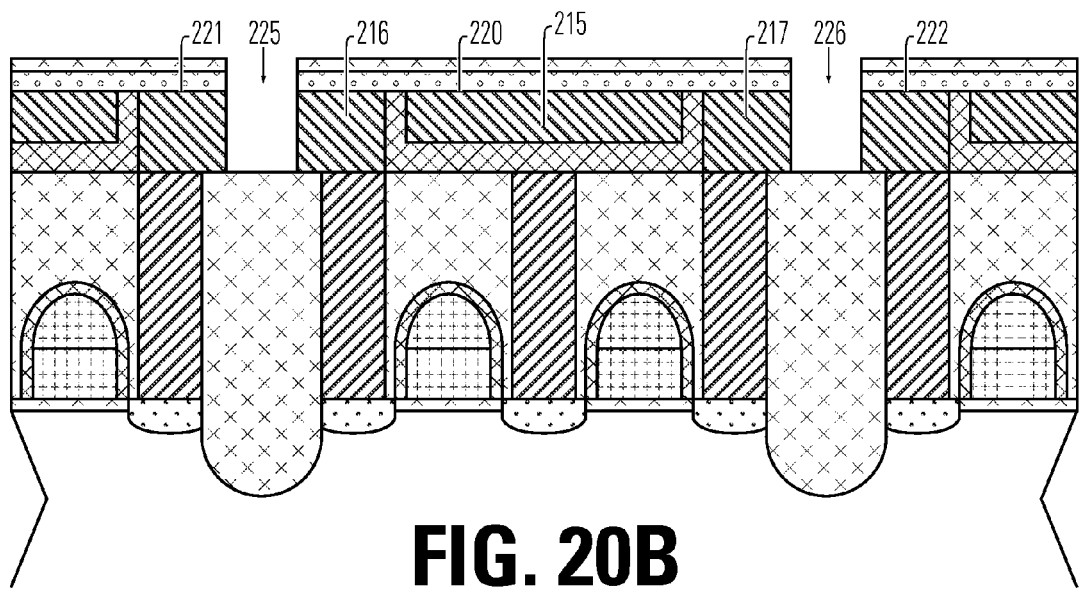

FIGS. 20A and 20B illustrate a next stage in the process, in which the photoresist structures 210*a*, 210*b*, 211*a*, 211*b*, 212*a* and 212*b* are used as etch masks to define cell structures 220*a*, 220*b*, 221*a*, 221*b*, 222*a* and 222*b* by etching trenches 225, 226 to the isolation dielectric structures in the structure 99, and the trenches 227 between columns of cells orthogonal to the word lines. The cell structure 220*a* includes a first electrode member 215, a second electrode member 216 and a third electrode member 217. Insulating member 163 separates the first electrode member 215 from the second electrode member 216. Insulating member 164 separates the first electrode member 215 from the third electrode member 217. A bridge 218 of memory material overlies the electrode members 215, 216 and 217 and the insulating members 163, 164 to establish two memory cells on the structure 220.

Figure 21:
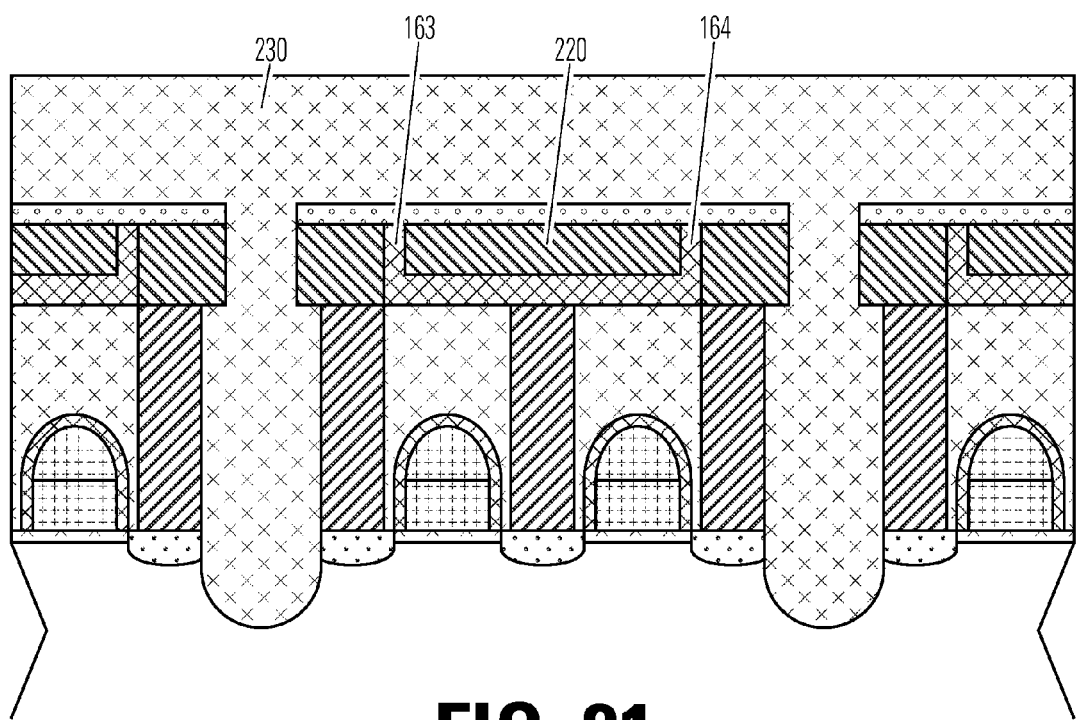
FIG. 21 shows a cross-sectional view corresponding to steps for forming a dielectric fill layer over the structure shown in FIGS. 20A and 20B, including the electrode layer and the bridges of phase change material.

FIG. 21 illustrates a next stage in the process, in which a dielectric fill layer 230 with a planar top surface is formed over the electrode structures and fills the gaps and trenches between them. In an embodiment of the process, the fill layer 230 is formed by high-density plasma HDP chemical vapor deposition CVD, followed by chemical mechanical polishing and cleaning. The dielectric fill may comprise silicon oxides, silicon nitrides, and other insulating materials, preferably having good thermal as well as electrical insulating properties.

In some embodiments a structure for thermally insulating the bridges is provided, in addition to or instead of the dielectric fill layer. In one example, the thermally insulating structure is formed by providing a cap layer of thermally insulating material over the bridges (218) and optionally over the electrode layer, before applying the dielectric fill. Representative materials for the layer of thermally insulating material include materials that are a combination of the elements silicon Si, carbon C, oxygen O, fluorine F, and hydrogen H. Examples of thermally insulating materials which are candidates for use for the thermally insulating cap layer include SiO2, SiCOH, polyimide, polyamide, and fluorocarbon polymers. Other examples of materials which are candidates for use for the thermally insulating cap layer include fluorinated SiO2, silsesquioxane, polyarylene ethers, parylene, fluoropolymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void in the dielectric fill formed over the bridge 218 for thermal insulation. A single layer or combination of layers can provide thermal and electrical insulation.

Figure 22A:
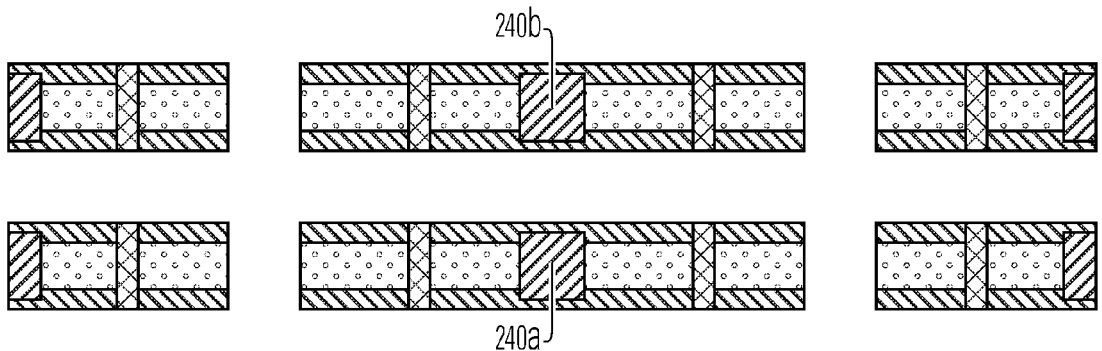
FIGS. 22A and 22B show layout and cross-sectional views after formation of conductive plugs in the dielectric fill layer contacting the bridges of phase change material in the structure shown in FIG. 21.
Figure 22B:
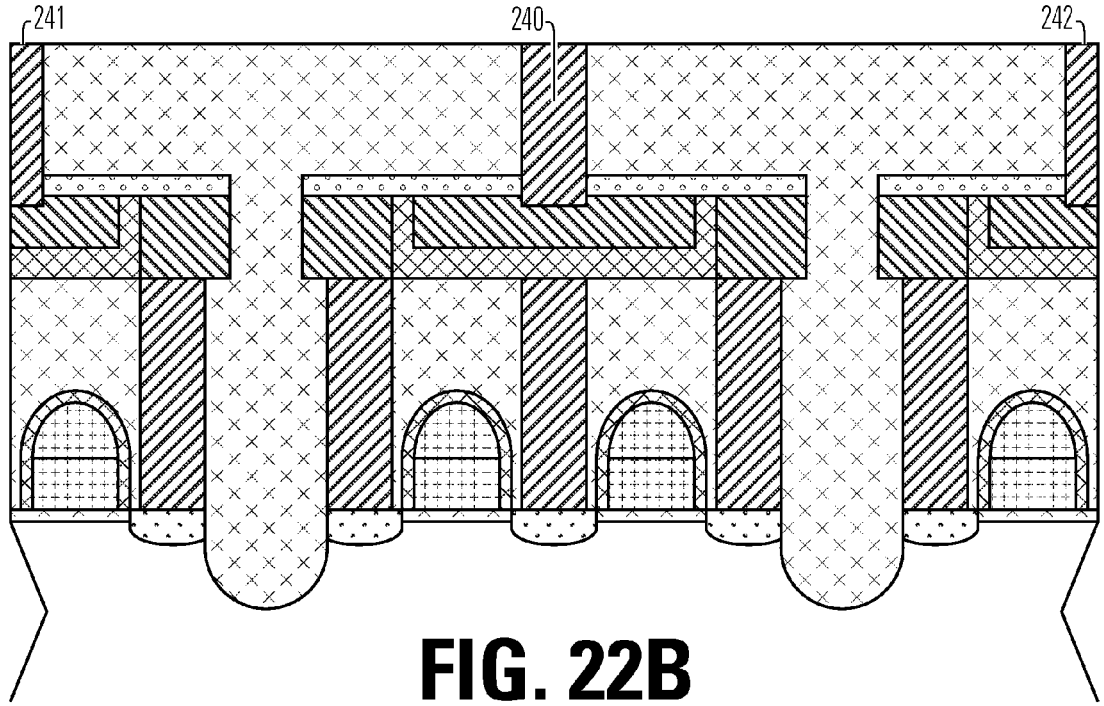

FIGS. 22A and 22B illustrate a next stage in the process, in which vias (not shown) are etched in the fill layer 230 to the electrode material, through the memory material and the fill. The via etch process may be a single anisotropic etch for both the fill and the memory material, or a two step process first etching the fill material with a first etch chemistry, and second etching the memory material with a second etch chemistry. After forming the vias, the vias are filled with tungsten or other conductive material, to form plugs 240, 241 and 242 contacting the first electrode member (e.g. member 215) in the electrode structures, for electrical communication with circuitry above the electrode layer. In embodiments of the process, the vias are lined with a diffusion barrier layer and/or an adhesion layer, as known in the art, and filled with tungsten or other suitable conductive material. The structure is then planarized by chemical mechanical polishing and cleaned. Finally a "clean up" etch is applied and the resulting structure is cleaned.

Figure 23:
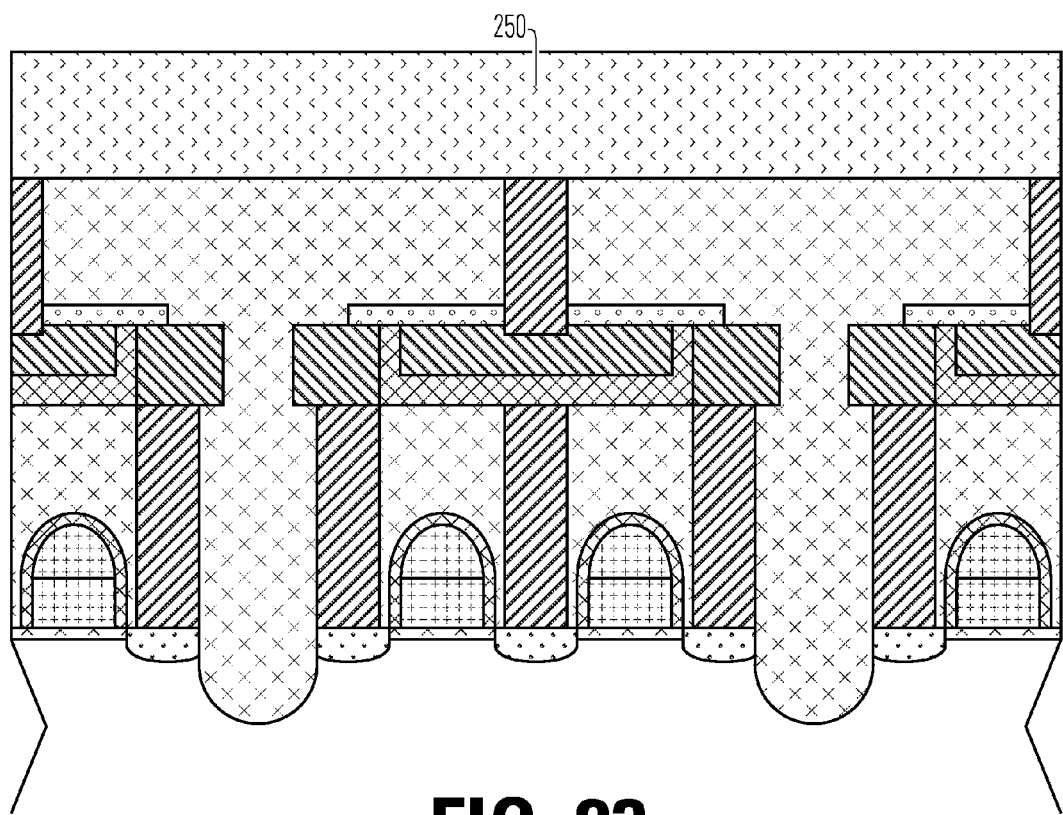
FIG. 23 shows a cross-sectional view corresponding to steps for forming a patterned conductive layer structure over the structure shown in FIGS. 22A and 22B.

FIG. 23 illustrates a next stage in the process, in which a patterned conductive layer 250 is formed in contact with the plugs over the fill layer, providing bit lines and other conductors for the memory device, yielding the structure shown and described above with respect to FIG. 5. In embodiments of the process, a copper alloy damascene metallization process is used in which the patterned conductive layer is formed depositing fluorosilicate glass (FSG) on the exposed surface, and then forming a photoresist pattern in the pattern desired. An etch is applied removing exposed FSG, and then liner and seed layers are deposited in the pattern. Then, copper plating is applied to fill the pattern. After plating, an anneal step is applied, followed by a polishing process. Other embodiments can use standard Al—Cu processes, or other metallization processes known in the art.

A cell described herein comprises two bottom electrodes with a dielectric spacer in between and a bridge of phase change material on the top of the electrodes spanning across the spacer. The bottom electrodes and dielectric spacer are formed in an electrode layer over front-end-of-line CMOS logic structures or other function circuit structures, providing a structure that easily support embedded memory and function circuits on a single chip, such as chips referred to as system on a chip SOC devices.

Figure 24:
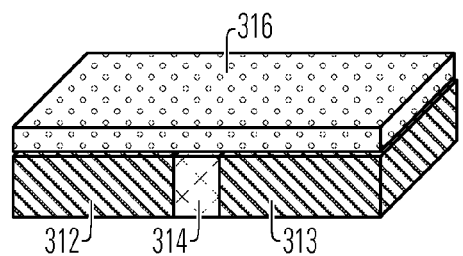
FIG. 24 illustrates a phase change material deposited on top of first and second electrodes, the electrode separated by an insulation member.
Figure 25:
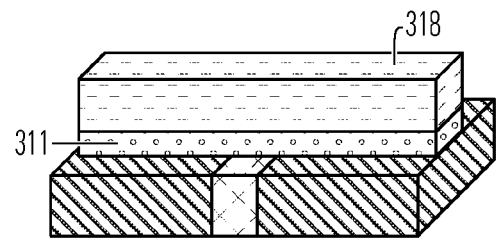
FIG. 25 shows the structure of FIG. 24 after photoresist mask deposition and etching steps.
Figure 26:
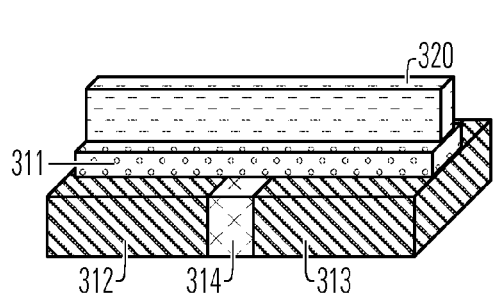
FIG. 26 shows the structure of FIG. 25 after a mask trimming step.
Figure 27:
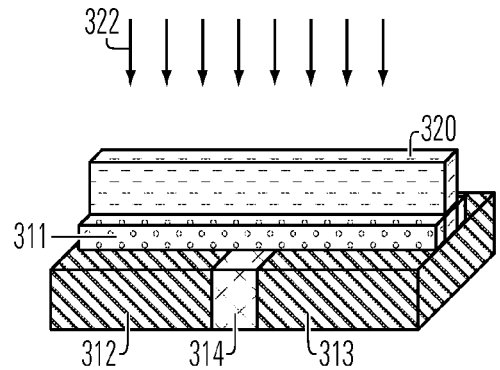
FIG. 27 illustrates implantation of an element into the exposed portions of the phase change material.
Figure 28:
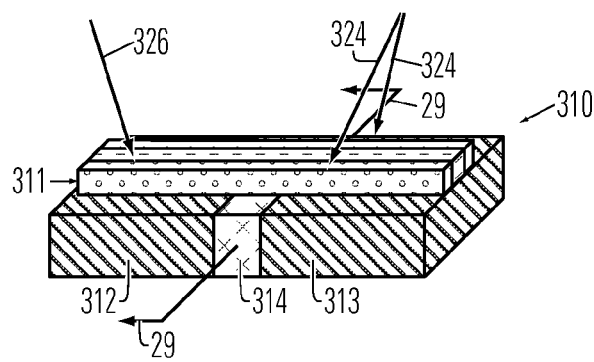
FIGS. 28 and 29 are overall and cross-sectional views of the phase change memory cell after removal of the photoresist mask.

FIGS. 24-31 illustrate a further embodiment of a phase change memory cell made according to the invention. FIG. 24 illustrates first and second electrodes 312, 313 separated by an insulation member 314. A phase change material 316 is deposited over electrodes 312, 313 and insulation member 314. FIG. 25 illustrates results of depositing a photoresist mask 318 over phase change material 316 followed by the removal of phase change material 316 not covered by mask 318, typically through an appropriate etching procedure. This creates a phase change element, specifically a phase change bridge 311 of phase change material. Thereafter photoresist mask 318 is trimmed to create the reduced size mask 320 of FIG. 26. The width of reduced size mask 320 is well below the minimum photolithographic feature size used to create mask 318. Trimming is typically by a photoresist oxygen plasma trimming process but may be by other processes as well. Reduced size mask 320 is positioned generally centrally along the length of phase change bridge 311 to expose bridge 311 to implantation as suggested in FIG. 27.

Implantation 322, such as ion implantation, may be accomplished with an element, or combination of elements, that increases the transition temperature of phase change material 316 both when phase change material 316 transitions from generally amorphous to generally crystalline states and especially during reset, that is when phase change material 316 transitions from generally crystalline to generally amorphous states. Examples of such elements include carbon, silicon, nitrogen, and aluminum. Removal of mask 318 results in phase change memory cell 310, including phase change bridge 311, of FIGS. 28 and 29. Phase change bridge 311 includes higher transition temperature portions 324 on either side of lower transition temperature portion 326. In this preferred embodiment implantation is used to raise the transition temperature of portions of phase change bridge 311. In one embodiment the transition temperature of higher transition temperature portions 324 is typically at least about 100° C. greater than the transition temperature of lower transition temperature portion 326 when the higher transition temperature portion 324 is in a generally amorphous state and of the lower transition temperature portion 326 is in a generally crystalline state. As electricity passes between first and second electrodes 312, 313, a phase change region 328 of portion 326, located above insulation member 314, can transition between generally crystalline and generally amorphous states before the implanted phase change material of portions 324 on either side of region 328 can make such transition. In some embodiments implantation may be used to lower the transition temperature of portion 326 instead of or in addition to raising the transition temperature of portions 324.

Figure 29:
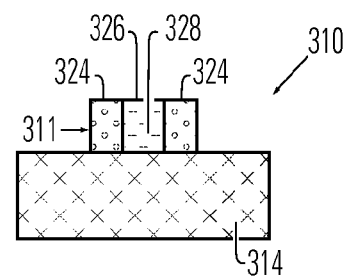
Figure 30:
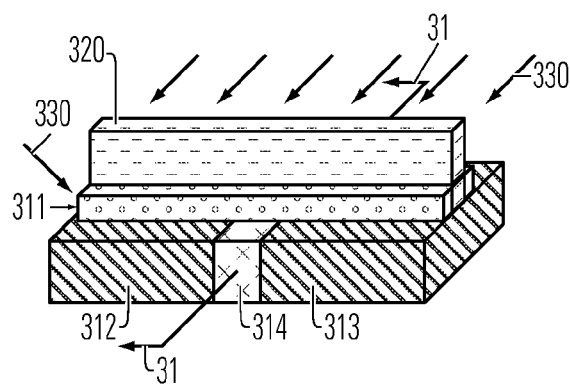
FIG. 30 illustrates an alternative to the implantation technique of FIG. 27 in which implantation is at an angle so to create a smaller phase change region.
Figure 31:
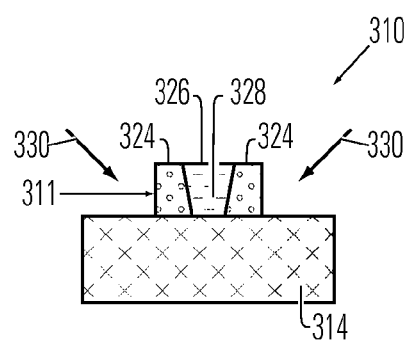
FIG. 31 is a cross-sectional view taken along line 31-31 of FIG. 30 illustrating the narrowed phase change region created by the angled implantation.

FIGS. 30 and 31 illustrate higher angle implantation 330 which creates a narrowed phase change region 328 compared to phase change region 328 of FIG. 29. This helps to further concentrate current at phase change region 328 to help reduce the current and power required to create the desired generally crystalline to generally amorphous phase change.

An advantage of the invention discussed above with regard to FIGS. 24-31 is that by isolating phase change region 328 of lower transition temperature portion 326 between higher transition temperature portions 324, greater thermal isolation of phase change region 328 is achieved thereby reducing reset current and power.

Another aspect of the invention relates to the thermal conductivity of the higher and lower transition temperature portions 324, 326 when both are in the same generally crystalline or generally amorphous state. Preferably, the thermal conductivity of higher transition temperature portions 324 is less than, and more preferably at least about 50% less than, the thermal conductivity of lower transition temperature portion 326 when both are in generally amorphous states. Similarly, the thermal conductivity of higher transition temperature portions 324 is less than, and more preferably at least about 50% less than, the thermal conductivity of lower transition temperature portion 326 when both are in generally amorphous states. These factors help to further thermally isolate phase change region 328 of portion 326. Examples of appropriate implant elements include nitrogen, oxygen and silicon.

A further aspect of the invention relates to the electrical resistivity of the higher and lower transition temperature portions 324, 326. Preferably the electrical resistivity of higher transition temperature portion 324 is greater than, and more preferably at least about 50% greater than, the electrical resistivity of lower transition temperature portion 326 when both are in generally amorphous states. Similarly, the electrical resistivity of higher transition temperature portion 324 is greater than, and more preferably at least about 50% greater than, the electrical resistivity of lower transition temperature portion 326 when both are in generally crystalline states. In addition, the electrical resistance of higher transition temperature portion 324 is preferably greater than, and more preferably at least about 50% greater than, the electrical resistance of lower transition temperature portion 326 when both are in generally amorphous states. Similarly, the electrical resistance of higher transition temperature portion 324 is preferably greater than, and more preferably at least about 50% greater than, the electrical resistance of lower transition temperature portion 326 when both are in generally crystalline states. These aspects help to concentrate electrical current through phase change region 328 of lower transition temperature portion 326 to help reduce transition current and power, especially during reset.

It is preferred that higher transition temperature portion 324 be in and remain in its generally amorphous state because the thermal and electrical conductivity of materials in a generally amorphous state are typically less than the thermal and electrical conductivity in a generally crystalline state.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

The invention claimed is:

1. A phase change memory cell, comprising:
   first and second electrodes;
   first and second electrodes spaced apart by a gap;
   the first and second electrodes having generally coplanar surfaces spaced apart by the gap;
   a phase change memory element located external of the gap and electrically coupling the coplanar surfaces of the first and second electrodes;
   at least a section of the phase change memory element comprising a first transition temperature portion and a second transition temperature portion, wherein the transition temperature of the first transition temperature portion is higher than the 2. The phase change memory cell according to claim 1, wherein the transition temperature of the first transition temperature portion is at least about 100° C. greater than the transition temperature of the second transition temperature portion.

3. The phase change memory cell according to claim 1, wherein the thermal conductivity of the first transition temperature portion is less than the thermal conductivity of the second transition temperature portion when both are in generally crystalline states.

4. The phase change memory cell according to claim 1, wherein the thermal conductivity of the first transition temperature portion is at least about 50% less than the thermal conductivity of the second transition temperature portion when both are in generally crystalline states.

5. The phase change memory cell according to claim 1, wherein the electrical resistivity of the first transition temperature portion is greater than the electrical resistivity of the second transition temperature portion when both are in generally crystalline states.

6. The phase change memory cell according to claim 1, wherein the electrical resistivity of the first transition temperature portion is at least about 50% greater than the electrical resistivity of the second transition temperature portion when both are in generally crystalline states.

7. The phase change memory cell according to claim 1, wherein the electrical resistance of the first transition temperature portion is greater than the electrical resistance of the second transition temperature portion when both are in generally crystalline states.

8. The phase change memory cell according to claim 1, wherein the electrical resistance of the first transition temperature portion is at least about 50% greater than the electrical resistance of the second transition temperature portion when both are in generally crystalline states.

9. The phase change memory cell according to claim 1, wherein the section of the phase change memory element comprises third and fourth of the first transition temperature portion located on different sides of the second transition temperature portion.

10. The phase change memory cell according to claim 1, wherein the phase change memory element comprises an alloy including a combination of two or more materials from the group of Ge, Sb, Te, Se, In, Ti, Ga, Bi, Sn, Cu, Pd, Pb, Ag, S, and Au.

11. The phase change memory cell according to claim 1, wherein the first and second electrodes comprise an element selected from a group consisting of Ti, W, Mo, Al, Ta, Cu, Pt, Ir, La, Ni, and Ru and alloys thereof.

12. A phase change memory cell, comprising:
   first and second electrodes spaced apart by a gap;
   a phase change memory element located external of the gap and electrically coupling the first and second electrodes;
   at least a section of the phase change memory element comprising a first transition temperature portion and a second transition temperature portion, wherein the transition temperature of the first transition temperature portion is higher than the transition temperature of the second transition temperature portion; and
   the second transition temperature portion comprising a phase change region which can be transitioned, by the passage of electrical current therethrough, from generally crystalline to generally amorphous states at a lower temperature than the first transition temperature portion.

13. A phase change memory cell, comprising:
   first and second electrodes spaced apart by a gap;
   a phase change memory element located external of the gap and electrically coupling the first and second electrodes;
   at least a section of the phase change memory element comprising a first transition temperature portion and a second transition temperature portion, wherein the transition temperature of the first transition temperature portion is higher than the transition temperature of the second transition temperature portion; and
   the first transition temperature portion having an element implanted therein, said element being effectively absent from the second transition temperature portion.

14. The phase change memory cell according to claim 13, wherein said element comprises at least one of carbon, silicon, oxygen, nitrogen and aluminum.

* * * * *

UNITED STATES PATENT AND TRADEMARK OFFICE
CERTIFICATE OF CORRECTION

| | | |
|---|---|---|
| PATENT NO. | : 7,902,538 B2 | Page 1 of 1 |
| APPLICATION NO. | : 12/266200 | |
| DATED | : March 8, 2011 | |
| INVENTOR(S) | : Lung | |

It is certified that error appears in the above-identified patent and that said Letters Patent is hereby corrected as shown below:

In claim 1, column 15, line 33, delete the phrase "first and second electrodes;"

In claim 1, column 15, line 44, after the word "the" insert the phrase -- transition temperature of the second transition temperature portion. --

Signed and Sealed this
Seventeenth Day of May, 2011

David J. Kappos
*Director of the United States Patent and Trademark Office*